United States Patent
Hasegawa et al.

(10) Patent No.: US 10,844,996 B2
(45) Date of Patent: Nov. 24, 2020

(54) DISPLAY DEVICE AND STAND SET

(71) Applicant: Panasonic Intellectual Property Management Co., Ltd., Osaka (JP)

(72) Inventors: Yuichi Hasegawa, Hyogo (JP); Shinya Ishida, Osaka (JP); Kazuki Kumagai, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/470,261

(22) PCT Filed: Dec. 22, 2017

(86) PCT No.: PCT/JP2017/046075
§ 371 (c)(1),
(2) Date: Jun. 17, 2019

(87) PCT Pub. No.: WO2018/123846
PCT Pub. Date: Jul. 5, 2018

(65) Prior Publication Data
US 2019/0309894 A1    Oct. 10, 2019

(30) Foreign Application Priority Data
Dec. 28, 2016  (JP) .................. 2016-256014

(51) Int. Cl.
*F16M 11/04* (2006.01)
*F16M 11/20* (2006.01)
(Continued)

(52) U.S. Cl.
CPC .......... *F16M 11/046* (2013.01); *F16M 11/08* (2013.01); *F16M 11/2014* (2013.01);
(Continued)

(58) Field of Classification Search
CPC .... F16M 11/24; F16M 11/2014; F16M 11/28; F16M 11/08; F16M 11/046;
(Continued)

(56) References Cited

U.S. PATENT DOCUMENTS 4,964,606 A * 10/1990 Beam ...................... F16M 11/14
248/188.5
5,385,323 A * 1/1995 Garelick .................. A47C 3/28
248/157
(Continued)

FOREIGN PATENT DOCUMENTS

DE   202010010832 U1   11/2010
GB        2471370 A  * 12/2010  .......... F16M 11/046
WO   2012/023172       2/2012

OTHER PUBLICATIONS

International Search Report of PCT application No. PCT/JP2017/046075 dated Mar. 20, 2018.
(Continued)

Primary Examiner — Hiwot E Tefera
Assistant Examiner — Taylor L Morris
(74) Attorney, Agent, or Firm — McDermott Will & Emery LLP

(57) ABSTRACT

A display device includes a display unit having a panel-shape, a stand supporting the display unit, an adjusting mechanism being attached to the display unit and enabling the display unit to move up and down relative to the stand and turn around the stand, a first fastening member fastening the adjusting mechanism to the stand, and a regulating mechanism regulating the display unit from descending relative to the stand when the first fastening member is removed. The regulating mechanism includes a projection being formed on one of the stand and the adjusting mechanism, and a recess being formed in the other of the stand and
(Continued)

US 10,844,996 B2 the adjusting mechanism and being fitted onto the projection.

6 Claims, 18 Drawing Sheets

(51) Int. Cl.
    *H04N 5/64*     (2006.01)
    *F16M 11/08*     (2006.01)
    *H05K 5/02*     (2006.01)
    *G09F 7/20*     (2006.01)
    *G06F 1/16*     (2006.01)
    *G09F 9/30*     (2006.01)

(52) U.S. Cl.
    CPC ............. *H04N 5/64* (2013.01); *H05K 5/0217* (2013.01); *H05K 5/0234* (2013.01); *F16M 2200/028* (2013.01); *G06F 1/1601* (2013.01); *G09F 7/20* (2013.01)

(58) Field of Classification Search
    CPC ........ F16M 2200/028; A47B 2097/005; A47B 2200/0023; H05K 5/0234; H05K 5/0217; H04N 5/64; G09F 7/20
    USPC ......................................... 248/519, 539, 910
    See application file for complete search history.

(56) References Cited

U.S. PATENT DOCUMENTS

| | | | | |
|---|---|---|---|---|
| 5,537,290 A * | 7/1996 | Brown | ................. | A47B 83/001 248/442.2 |
| 5,553,820 A * | 9/1996 | Karten | ............... | A47B 21/0314 248/181.2 |
| 5,738,316 A * | 4/1998 | Sweere | ................. | F16M 11/10 248/123.11 |
| 5,772,174 A * | 6/1998 | Hirsch | ................... | A47B 23/04 248/278.1 |
| 5,797,568 A * | 8/1998 | Canton Gongora | ... | F16M 11/10 248/122.1 |
| 5,931,102 A * | 8/1999 | Grahl | ................. | A47B 17/033 108/143 |
| 6,305,659 B1 * | 10/2001 | Metelski | ................ | F16M 11/42 248/519 |
| 6,857,610 B1 * | 2/2005 | Conner | ................. | F16M 11/14 248/284.1 |
| 6,863,252 B2 * | 3/2005 | Bosson | ............... | F16M 11/041 248/131 |
| 7,114,688 B2 * | 10/2006 | Rudolf | ................ | F16C 11/0619 248/278.1 |
| 7,118,080 B2 * | 10/2006 | Chan | .................... | A47B 23/046 248/129 |
| 7,182,301 B1 * | 2/2007 | Oddsen, Jr. | ............ | F16M 11/10 248/122.1 |
| 7,369,401 B1 * | 5/2008 | Floersch | ................ | F16M 11/08 292/301 |
| 7,424,991 B2 * | 9/2008 | Kim | .................... | F16C 11/0619 248/121 |
| 7,546,991 B2 * | 6/2009 | Wang | ..................... | F16M 11/08 248/125.1 |
| 7,564,682 B2 * | 7/2009 | Liou | ..................... | F16M 11/105 248/125.1 |
| 7,712,710 B2 * | 5/2010 | Root | ..................... | F16B 7/1472 248/125.8 |
| 7,798,339 B2 * | 9/2010 | Brooks | ................ | G11B 33/02 211/103 |
| 8,066,232 B2 * | 11/2011 | Wills | ..................... | F16M 11/10 248/121 |
| 8,162,268 B1 * | 4/2012 | Huang | .................. | F16M 11/08 248/124.1 |
| 8,191,487 B2 * | 6/2012 | Theesfeld | ............. | A47B 57/06 108/106 |
| 8,282,052 B2 * | 10/2012 | Huang | ................. | F16M 11/045 248/125.1 |
| 8,659,884 B2 * | 2/2014 | Segar | ..................... | F16M 11/08 361/679.22 |
| 8,998,157 B2 * | 4/2015 | Culberson | ............ | H05K 5/0017 248/231.61 |
| 9,089,216 B2 * | 7/2015 | Liu | ......................... | F16M 11/10 |
| 9,204,723 B2 * | 12/2015 | Floersch | ................ | A47B 97/00 |
| 9,291,298 B2 * | 3/2016 | Shin | ......................... | G06F 1/20 |
| 9,400,083 B2 * | 7/2016 | Sapper | .................. | F16M 13/022 |
| 9,746,128 B2 * | 8/2017 | Huang | ................ | F16M 11/2014 |
| 10,066,785 B1 * | 9/2018 | Chen | ................... | F16C 11/0614 |
| 10,352,497 B2 * | 7/2019 | Yokiel | .................. | F16M 11/2021 |
| 2004/0178314 A1 * | 9/2004 | Chen | ........................ | F16M 11/08 248/349.1 |
| 2005/0151043 A1 * | 7/2005 | Kim | ..................... | F16M 11/105 248/274.1 |
| 2006/0065795 A1 * | 3/2006 | Blackburn | ............. | F16M 11/14 248/122.1 |
| 2006/0158836 A1 * | 7/2006 | Phillips | .................. | F16M 11/08 361/679.22 |
| 2006/0202091 A1 * | 9/2006 | Oddsen, Jr. | ............ | F16M 11/24 248/122.1 |
| 2007/0102607 A1 * | 5/2007 | Koh | ........................ | F16M 11/10 248/276.1 |
| 2007/0215762 A1 * | 9/2007 | Lee | ......................... | F16M 11/08 248/125.7 |
| 2008/0116333 A1 * | 5/2008 | Chang | .................... | F16M 11/28 248/200.1 |
| 2008/0164395 A1 * | 7/2008 | Chang | ................... | F16M 11/105 248/276.1 |
| 2009/0173847 A1 * | 7/2009 | Dittmer | ................. | F16M 11/041 248/125.2 |
| 2009/0212184 A1 * | 8/2009 | Bourgeois | .............. | F16M 11/10 248/288.11 |
| 2009/0266964 A1 * | 10/2009 | Hung | .................... | F16M 11/14 248/323 |
| 2010/0157513 A1 | 6/2010 | Guo | | |
| 2011/0079692 A1 * | 4/2011 | Li | ......................... | F16M 11/105 248/220.21 |
| 2011/0090410 A1 * | 4/2011 | Ye | ......................... | F16M 11/105 348/836 |
| 2012/0019997 A1 * | 1/2012 | Sakamoto | ............... | F16M 11/22 361/679.01 |
| 2012/0025037 A1 * | 2/2012 | Chang | ................. | F16M 11/2014 248/124.1 |
| 2012/0199711 A1 * | 8/2012 | Tsai | ...................... | F16M 11/14 248/220.22 |
| 2013/0021539 A1 * | 1/2013 | Austin | .................. | F16M 11/125 348/836 |
| 2013/0175422 A1 * | 7/2013 | Clarke | ................ | E04H 12/2269 248/523 |
| 2013/0292527 A1 | 11/2013 | Mochizuki et al. | | |
| 2013/0306580 A1 * | 11/2013 | Chen | ..................... | F16M 11/10 211/41.1 |
| 2014/0045139 A1 * | 2/2014 | Culberson | ............ | F16M 11/14 433/29 |
| 2014/0070059 A1 * | 3/2014 | Vieira | .................. | F16M 11/041 248/122.1 |
| 2014/0092317 A1 * | 4/2014 | Cheng | ..................... | H04N 5/655 348/794 |
| 2014/0092568 A1 * | 4/2014 | Kim | ........................ | H05K 7/00 361/752 |
| 2014/0117182 A1 * | 5/2014 | Blackburn | ............. | F16M 11/18 248/298.1 |
| 2014/0246552 A1 * | 9/2014 | Hunter | .................. | F16M 13/02 248/280.11 |
| 2015/0048224 A1 * | 2/2015 | Patterson | ............. | F16M 11/046 248/200.1 |
| 2015/0159804 A1 * | 6/2015 | Bowman | ............... | F16M 11/045 248/122.1 |
| 2015/0196192 A1 * | 7/2015 | Kan | ....................... | H04N 5/655 211/85.13 |
| 2016/0120303 A1 * | 5/2016 | Constantino | ......... | F16M 13/022 108/28 |

(56) References Cited

U.S. PATENT DOCUMENTS

| | | | |
|---|---|---|---|
| 2016/0143167 A1* | 5/2016 | Tseng | G02F 1/133308 |
| | | | 361/679.01 |
| 2017/0051865 A1* | 2/2017 | Chen | F16M 11/046 |
| 2018/0094768 A1* | 4/2018 | Burke | F16M 11/2014 |
| 2018/0172201 A1* | 6/2018 | Kim | F16M 11/18 |
| 2018/0328533 A1* | 11/2018 | Carrasquillo | F16M 11/16 |
| 2018/0372261 A1* | 12/2018 | Vlaar | F16M 11/08 |
| 2019/0313760 A1* | 10/2019 | LaPoint | F16M 11/121 |
| 2019/0353297 A1* | 11/2019 | Huang | F16M 11/16 |

OTHER PUBLICATIONS

The Extended European Search Report dated Nov. 19, 2019 for the related European Patent Application No. 17887634.8.

\* cited by examiner

DISPLAY DEVICE AND STAND SET

CROSS-REFERENCE TO RELATED APPLICATIONS

This application is a U.S. national stage application of the PCT International Application No. PCT/JP2017/046075 filed on Dec. 22, 2017, which claims the benefit of foreign priority of Japanese patent application No. 2016-256014 filed on Dec. 28, 2016, the contents all of which are incorporated herein by reference.

TECHNICAL FIELD

The present disclosure relates to a display device including a stand and to a stand set.

BACKGROUND ART

PTL 1 discloses a display device including a floor-positioned stand. In the display device, the stand supports a panel-shaped display unit having a display screen. The display device incorporates an up-and-down mechanism to move the display unit up or down relative to the stand and a swivel mechanism to make the display unit turn around the stand. The stand is, for example, attached to the up-and-down mechanism with bolts. If the bolts are removed, the display unit can move up and down relative to the stand so that a height of the display unit above a floor can be adjusted.

CITATION LIST

Patent Literature

PTL 1: WO 2012/023172 A

SUMMARY

The present disclosure provides a display device and a stand set that can improve safety.

A display device according to the present disclosure includes a display unit having a panel-shape, a stand supporting the display unit, an adjusting mechanism being attached to the display unit and enabling the display unit to move up and down relative to the stand and turn around the stand, a first fastening member fastening the adjusting mechanism to the stand, and a regulating mechanism regulating the display unit from descending relative to the stand when the first fastening member is removed. The regulating mechanism includes a projection being formed on one of the stand and the adjusting mechanism, and a recess being formed in another one of the stand and the adjusting mechanism and being fitted onto the projection.

A stand set according to the present disclosure includes a stand supporting a display unit that has a panel-shape, an adjusting mechanism being attached to the display unit and enabling the display unit to move up and down relative to the stand and turn around the stand, a first fastening member fastening the adjusting mechanism to the stand, and a regulating mechanism regulating the display unit from descending relative to the stand when the first fastening member is removed. The regulating mechanism includes a projection being formed on one of the stand and the adjusting mechanism, and a recess being formed in another one of the stand and the adjusting mechanism and being fitted onto the projection.

The display device and the stand set according to the present disclosure can improve safety.

DESCRIPTION OF EMBODIMENTS

Figure 1:
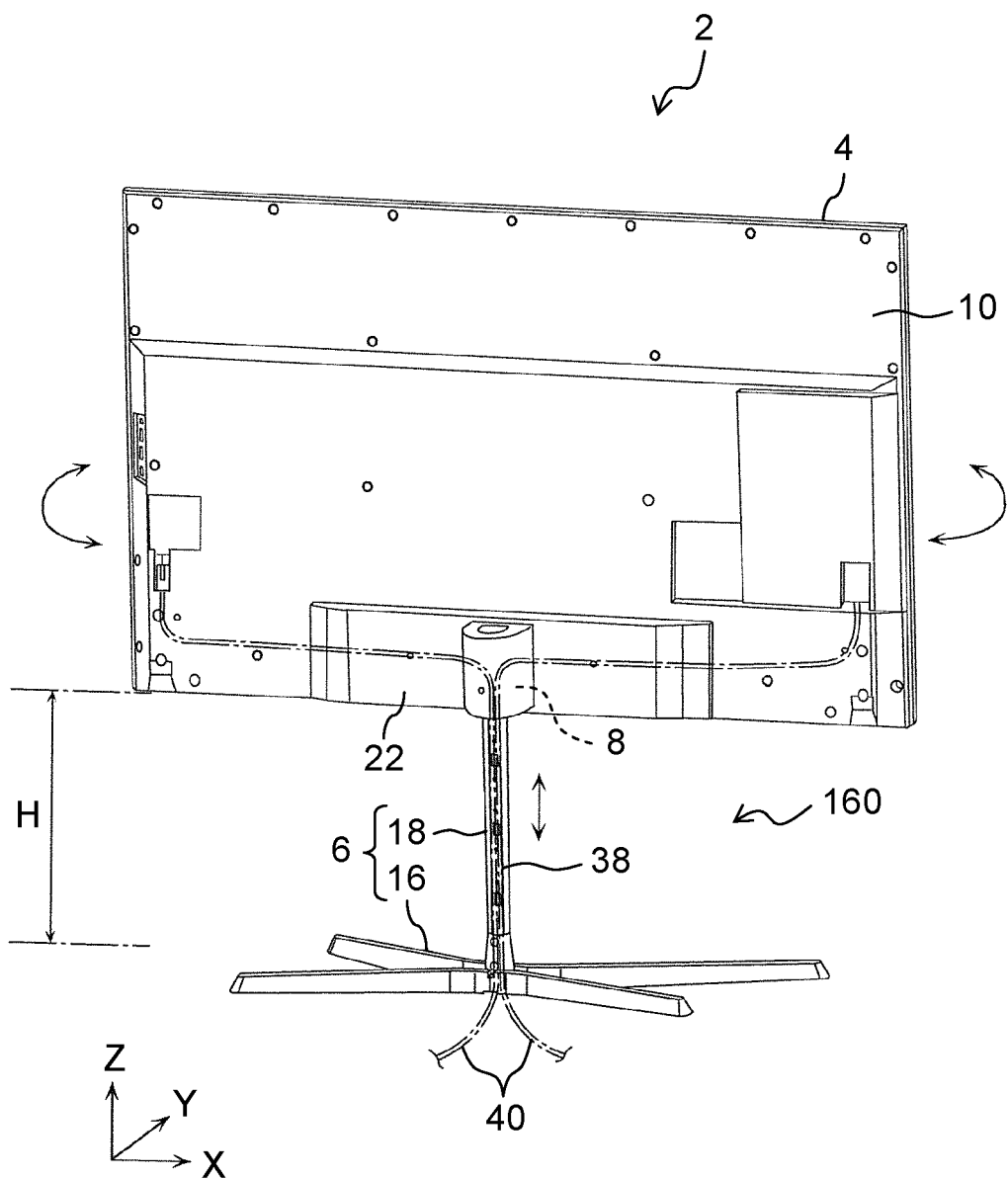
FIG. 1 is a perspective view schematically showing an example of an external appearance of a back elevation of a display device according to a first exemplary embodiment.

Hereinafter, exemplary embodiments will be described in detail with reference to the drawings as appropriate. However, unnecessarily detailed descriptions may be omitted. For example, a detailed description of well-known matters, and a duplicate description of substantially identical structures may not be provided. This is to avoid unnecessarily redundancy in the following description, and to facilitate understanding by those skilled in the art.

The accompanying drawings and the exemplary embodiments described below are provided for those skilled in the art to fully understand the present disclosure, and merely illustrate an example of the present disclosure. Numerical values, shapes, materials, constituent elements, arrangement positions and connection modes of the constituent elements, and the like described in the following exemplary embodiments are merely examples, and therefore are not intended to limit the subject matters of the claims. Also, of the constituent elements in the following exemplary embodiments, constituent elements not recited in the independent claim indicating the broadest concept may be optionally added to the constituent elements described in the independent claim.

Furthermore, the drawings are not necessarily accurate illustrations, but are schematic views simplified as appropriate for a clear description of the present disclosure. In the drawings, the same reference numerals are assigned to substantially the same constituent elements, and a duplicate description of such constituent elements may be omitted or simplified.

Three axes, i.e. an X-axis, a Y-axis, and a Z-axis, are shown in the drawings, and the following exemplary embodiments are described using the X, Y, and Z axes as required. In the present exemplary embodiment, for the sake of convenience, a direction parallel (substantially parallel) to long sides of display device 2 being installed onto a mounting surface (a floor) and being not turned around is defined as an X-axis direction, a direction parallel (substantially parallel) to short sides of display device 2 is defined as a Z-axis direction, and a direction orthogonal to both the X-axis and the Z-axis is defined as a Y-axis direction. Thus, in display device 2 being not turned around, the display screen of display unit 4 is substantially parallel to an X-Z plane. In display device 2, a side relatively farther from the mounting surface (the floor) is defined as a "top", a side relatively closer to the mounting surface (the floor) is defined as a "bottom", and a direction from the bottom to the top is defined as a positive Z-direction. A surface (i.e., a surface on which an image is displayed) of display device 2 is defined as a front or a fore, a surface of the display device opposite the front is defined as a rear or a back, a direction from the rear to the front (i.e., a direction in which an image is displayed) is defined as a positive Y-direction, and a direction from left to right, as seen by a viewer facing the rear of display device 2, is defined as a positive X-direction. In the following exemplary embodiments, components are described with reference to display device 2 that is placed on the mounting surface (the floor) substantially parallel to a horizontal plane (X-Y plane). For example, in a description of disassembled display device 2 that cannot be installed onto the mounting surface (the floor), the positive Z-direction is still defined as a direction toward the top, and a negative Z-direction is still defined as a direction toward the bottom. Definitions for the X-axis and the Y-axis are also given in the same way as in the other drawings. These directions, however, are not absolute directions, but are relative directions that are illustrated for the sake of convenience. These directions should not be construed to limit the present disclosure.

First Exemplary Embodiment

With reference to FIGS. 1 to 13H, a first exemplary embodiment will now be described.

[1-1. Configuration of Display Device]

First, with reference to FIGS. 1 and 2, a configuration of display device 2 according to the first exemplary embodiment will be described.

FIG. 1 is a perspective view schematically showing an example of an external appearance of a back elevation of display device 2 according to the first exemplary embodiment.

Figure 2:
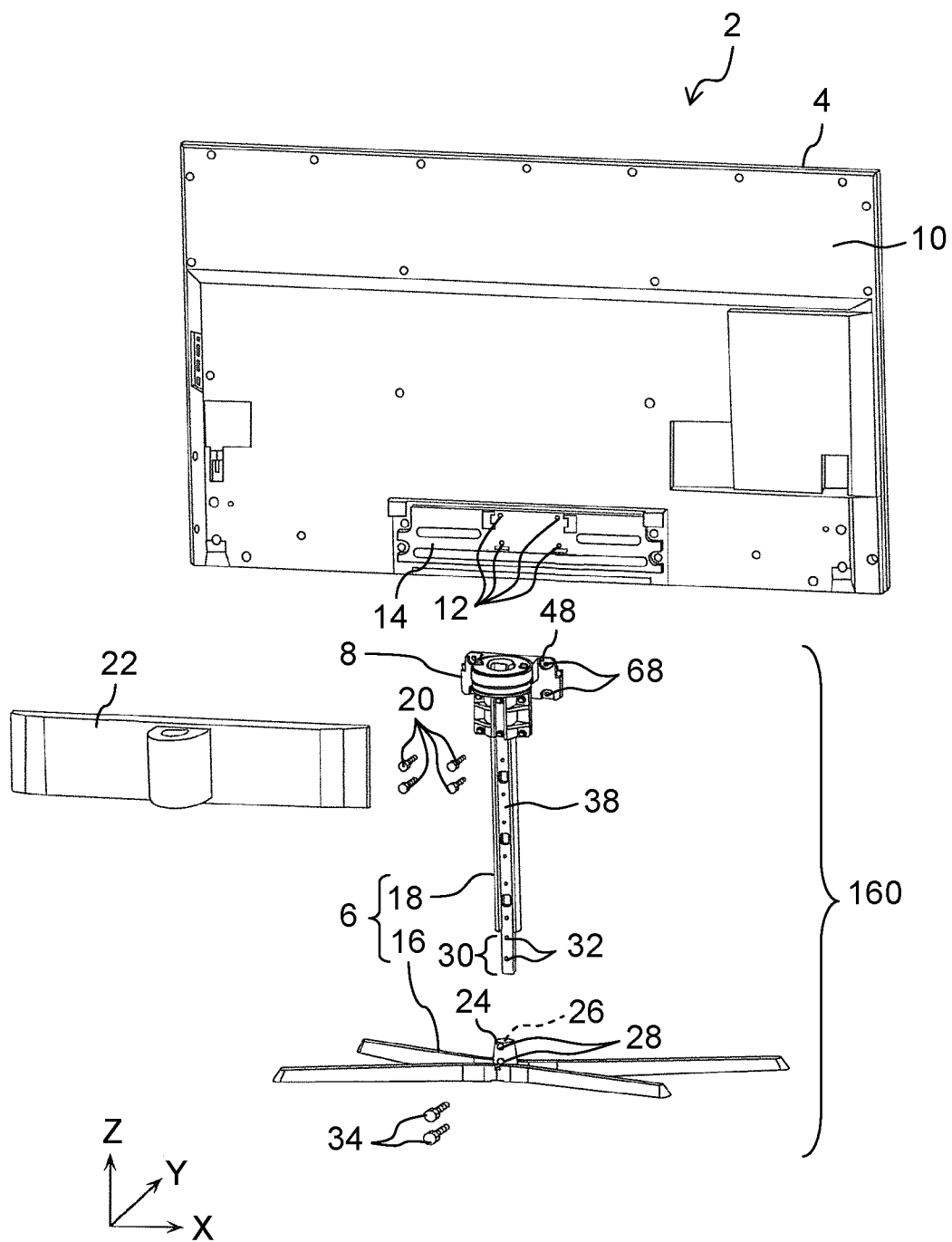
FIG. 2 is an exploded perspective view schematically showing an example of a configuration of the display device according to the first exemplary embodiment.

FIG. 2 is an exploded perspective view schematically showing an example of a configuration of display device 2 according to the first exemplary embodiment.

As shown in FIG. 1, display device 2 is, for example, a liquid crystal television receiver of a flat panel display type. Display device 2 includes display unit 4 and stand set 160. In display device 2, stand set 160 is a structure that supports display unit 4. Stand set 160 includes stand 6 and adjusting mechanism 8.

Display unit 4 has panel-shaped housing 10 and a display screen (not shown) that is disposed on a front (a surface on a positive Y-direction side) of housing 10. As shown in FIG. 2, mounting bracket 14 having a plurality of bolt holes 12 is attached to a lower end part (an end part on a negative Z-direction side) of a rear (a surface on a negative Y-direction side) of housing 10. In the present exemplary embodiment, in one example, a configuration in which four bolt holes 12 are formed in mounting bracket 14 is shown.

Stand 6 is a floor-positioned stand for supporting display unit 4. As shown in FIG. 2, stand 6 includes base member 16 and prop part 18 that stands on base member 16. In the present exemplary embodiment, stand 6 is configured such that prop part 18 is detachable from base member 16.

Adjusting mechanism 8 is a mechanism configured to support display unit 4 such that display unit 4 can move up and down relative to stand 6 (movable along a Z-axis direction) and turn around stand 6 (turnable along an X-Y plane). Specifically, adjusting mechanism 8 has an up-and-down function to adjust height H (a height in the Z-axis direction) of display unit 4 above a floor stepwise and a swivel function to adjust an orientation of the display screen of display unit 4 (turning relative to an X-Z plane along the X-Y plane) within a predetermined angular range. In the present exemplary embodiment, in one example, adjusting mechanism 8 has an up-and-down function to adjust height H in four levels and a swivel function to enable display unit 4 to turn relative to the X-Z plane within a range of −15° to +15°.

As shown in FIG. 2, adjusting mechanism 8 included in stand set 160 is attached to mounting bracket 14 on display unit 4 with a plurality of (e.g., four) bolts 20 and is supported by prop part 18 of stand 6. A number of bolts 20 is in agreement with a number of bolt holes 12. As shown in FIG. 1, adjusting mechanism 8 and mounting bracket 14 may be covered with covering member 22 for decoration. Covering member 22 may be attached to the rear of housing 10 with a hook (not shown), for example. Covering member 22 may be included in stand set 160 or may not be included in stand set 160.

[1-2. Configuration of Stand Set]

With reference to FIGS. 1 to 4, a configuration of stand set 160 will now be described.

Figure 3:
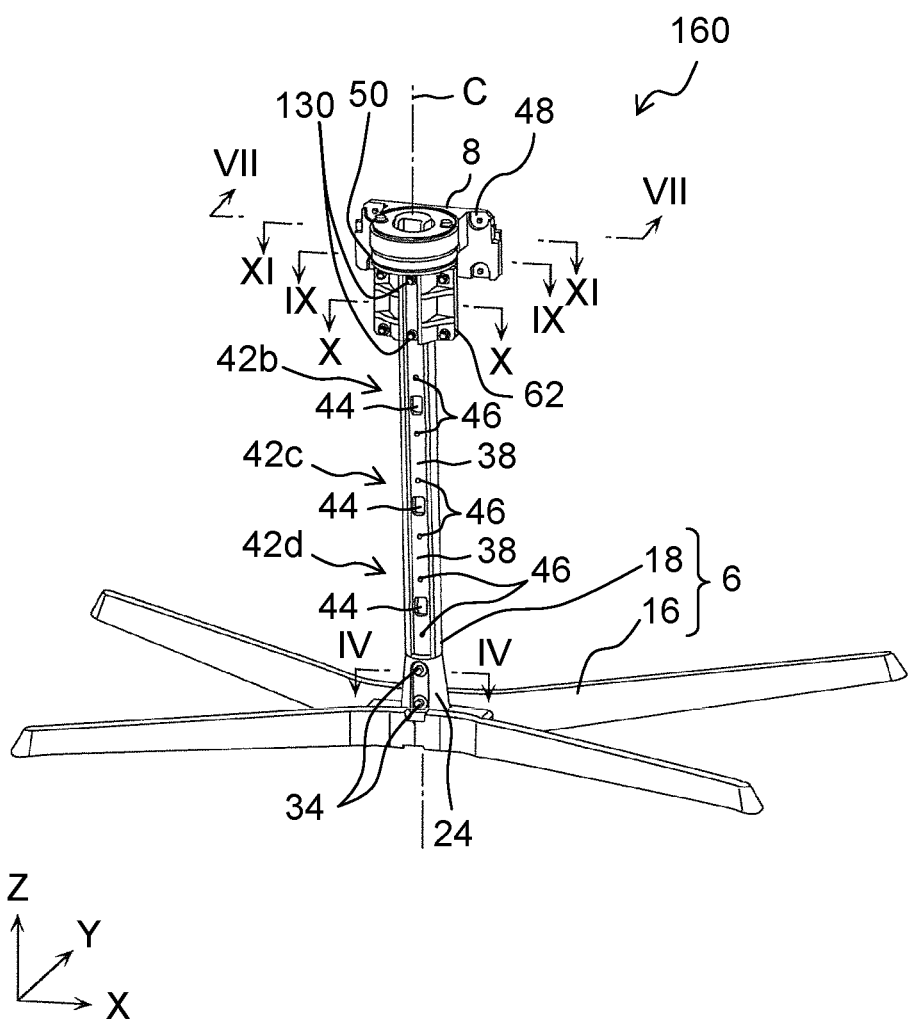
FIG. 3 is a perspective view schematically showing an example of a configuration of a stand set included in the display device according to the first exemplary embodiment.

FIG. 3 is a perspective view schematically showing an example of a configuration of stand set 160 included in display device 2 according to the first exemplary embodiment.

Stand set 160 includes a plurality of (e.g., a pair of) bolts 130 and regulating mechanism 127 (see FIG. 7), as well as stand 6 and adjusting mechanism 8 described above.

Figure 4:
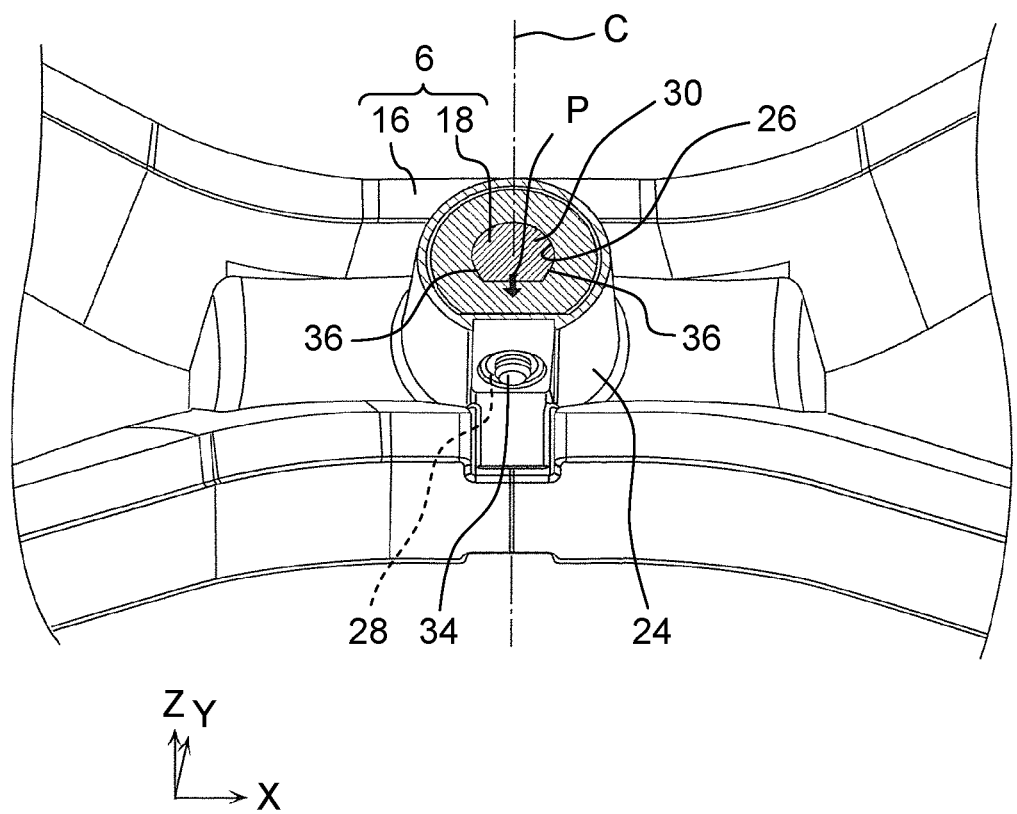
FIG. 4 is a cross-sectional view schematically showing an example of a configuration of a stand and an adjusting mechanism according to the first exemplary embodiment.

FIG. 4 is a cross-sectional view schematically showing an example of a configuration of stand 6 and adjusting mechanism 8 according to the first exemplary embodiment. FIG. 4 shows a perspective cross section taken along line IV-IV of FIG. 3.

As shown in FIGS. 1 to 3, base member 16 is formed into an X shape in a plan view (when viewed along the Z-axis direction) and is placed on a floor or a table (not shown) in a room, for example. In the present exemplary embodiment described herein, base member 16 is placed on a floor (not shown), for example. As shown in FIGS. 2 and 4, cylindrical joint part 24 is formed on a central part of base member 16, extending upward (in a positive Z-direction). Joint part 24 has hole 26 extending from a top (a surface on a positive Z-direction side) in a vertical direction (the Z-axis direction). As shown in FIG. 4, hole 26 is formed so as to have a substantially D-shaped cross section (a cross-sectional shape on the X-Y plane as viewed along the Z-axis direction), with a rear (a face on the negative Y-direction side) of the hole being flat. As shown in FIG. 2, a plurality of through holes 28 is formed in a lateral surface (a surface on the negative Y-direction side) of joint part 24. In the present exemplary embodiment, in one example, two through holes 28 are formed in a rear (the surface on the negative Y-direction side) of joint part 24.

Prop part 18 is long in shape, extending along axis C that extends in the vertical direction (the Z-axis direction). As shown in FIG. 2, a lower end part (an end part on the negative Z-direction side) of prop part 18 forms plug portion 30 protruding downward (in a negative Z-direction). Plug portion 30 has a plurality of (e.g., two) bolt holes 32 that corresponds with a plurality of (e.g., two) through holes 28 formed in joint part 24.

As shown in FIG. 4, plug portion 30 is formed so as to have a substantially D-shaped cross section (a cross-sectional shape on the X-Y plane as viewed along the Z-axis direction), with a rear (a surface on the negative Y-direction side) of plug portion 30 being flat, such that plug portion 30 corresponds in cross section to hole 26 of joint part 24. With plug portion 30 put into hole 26 in joint part 24, a plurality of (e.g., two) bolts 34 is screwed into the plurality of (e.g., two) bolt holes 32 of plug portion 30 through the plurality of (e.g., two) through holes 28 of joint part 24, respectively, so that prop part 18 is fastened to base member 16. In this state, a direction in which bolts 34 are inserted into bolt holes 32 (hereinafter also referred to as "a fastening direction") is a direction (a Y-axis direction) substantially perpendicular to axis C. Plug portion 30 is made smaller than hole 26 in cross section substantially perpendicular to axis C (a cross section parallel to the X-Y plane) so that plug portion 30 is readily put into hole 26 of joint part 24.

As shown in FIG. 4, hole 26 has a pair of inclined portions 36 in cross section substantially perpendicular to axis C (the cross section parallel to the X-Y plane). The pair of inclined portions 36 is disposed at positions substantially symmetric with respect to bolts 34 (virtually symmetric with respect to a Y-Z plane along axis C), and is tilted relative to a fastening direction of bolts 34 (the Y-axis direction). When bolts 34 are screwed into bolt holes 32, plug portion 30 is drawn toward bolts 34 as indicated with arrow P in FIG. 4. The pair of inclined portions 36 is tilted such that a space between inclined portions 36 gets narrower with an advance of a symmetrical center in the direction (the negative Y-direction) in which the plug portion is drawn. Thus, when bolts 34 are screwed into bolt holes 32, the pair of inclined portions 36 is pressed by an outer peripheral surface of plug portion 30. This configuration suppresses the occurrence of looseness at a joint between base member 16 and prop part 18 even if plug portion 30 is smaller than hole 26 in cross section perpendicular to axis C (a cross-sectional size on the X-Y plane) in order to facilitate insertion of plug portion 30 into hole 26.

As shown in FIG. 3, prop part 18 has groove portion 38 that is formed in a rear (a surface on the negative Y-direction side) of an outer peripheral surface. Groove portion 38 is depressed forward (in a positive Y-direction) and extends along axis C (in the Z-axis direction) from an upper end (an end on the positive Z-direction side) through a lower end (an end on the negative Z-direction side) of prop part 18. As shown in FIG. 1, groove portion 38 of prop part 18 contains a plurality of cables 40 extending from the rear (the surface on the negative Y-direction side) of housing 10 of display unit 4 and being tied together. Examples of the plurality of cables 40 include antenna cables and power cables. The plurality of cables 40 is fixed to the rear of housing 10 and groove portion 38 with cable ties (not shown) or other fasteners. Thus, the plurality of cables 40 at the rear (the surface on the negative Y-direction side) of prop part 18 is hidden behind prop part 18 when display device 2 is viewed from a front side (from the positive Y-direction). This configuration suppresses an external appearance of display device 2 from being spoiled. In FIG. 2, illustration of the plurality of cables 40 is omitted for the simplicity of description.

Figure 5:
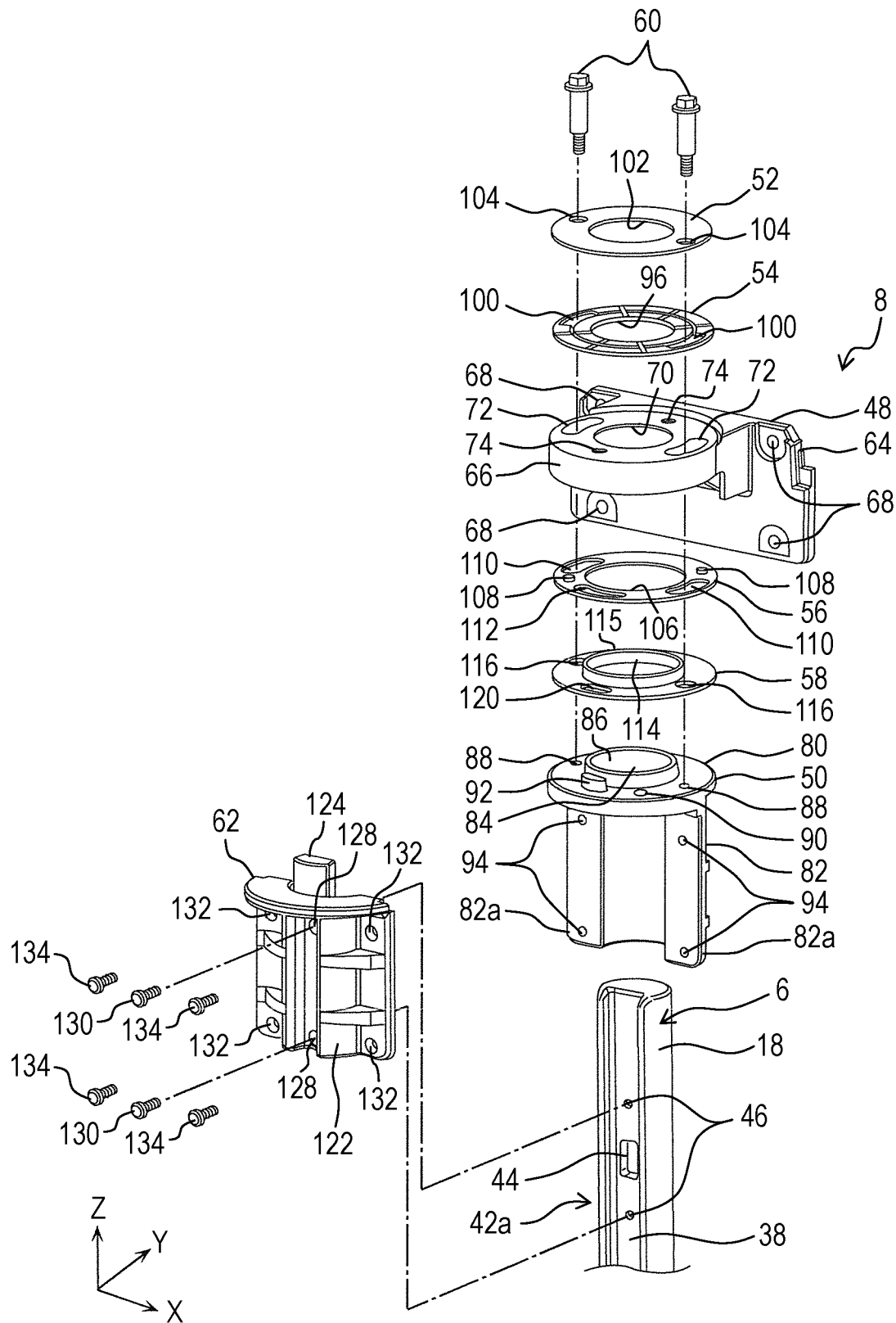
FIG. 5 is an exploded perspective view schematically showing an example of a configuration of the adjusting mechanism according to the first exemplary embodiment.

As shown in FIG. 3 and FIG. 5, which is described later, groove portion 38 of prop part 18 has a plurality of (e.g., four) height adjusting portions 42a, 42b, 42c, 42d for adjusting height H (the height in the Z-axis direction) of display unit 4 above the floor stepwise. In FIG. 3, height adjusting portion 42a is hidden by adjusting mechanism 8 and is hence not illustrated. Height adjusting portions 42a to 42d are disposed at intervals along axis C (in the Z-axis direction) from the top to the bottom (from the positive Z-direction side to the negative Z-direction side) in an order of height adjusting portions 42a, 42b, 42c, 42d. Height adjusting portions 42a to 42d each include recess 44 depressed forward (in the positive Y-direction) and a pair of bolt holes 46 disposed at upper and lower sides of recess 44 (at the positive and negative Z-direction sides of recess 44).

[1-3. Configuration of Adjusting Mechanism]

With reference to FIGS. 2, 3, and 5 to 11, a configuration of adjusting mechanism 8 will now be described.

Figure 6:
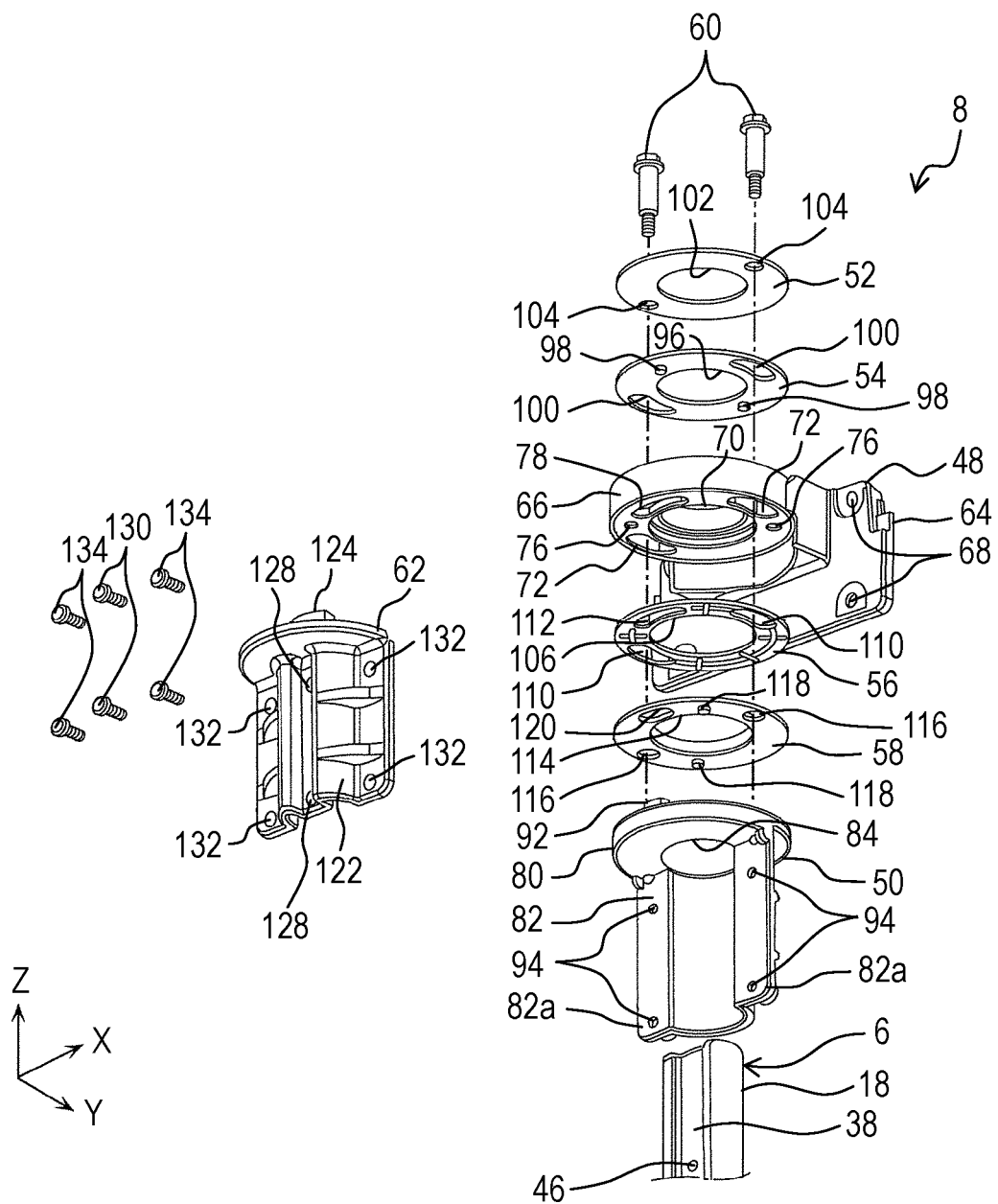
FIG. 6 is an exploded perspective view schematically showing an example of the configuration of the adjusting mechanism according to the first exemplary embodiment.

FIGS. 5 and 6 are each an exploded perspective view schematically showing an example of the configuration of adjusting mechanism 8 according to the first exemplary embodiment. FIGS. 5 and 6 show exploded perspective views of adjusting mechanism 8 viewed from different angles.

Figure 7:
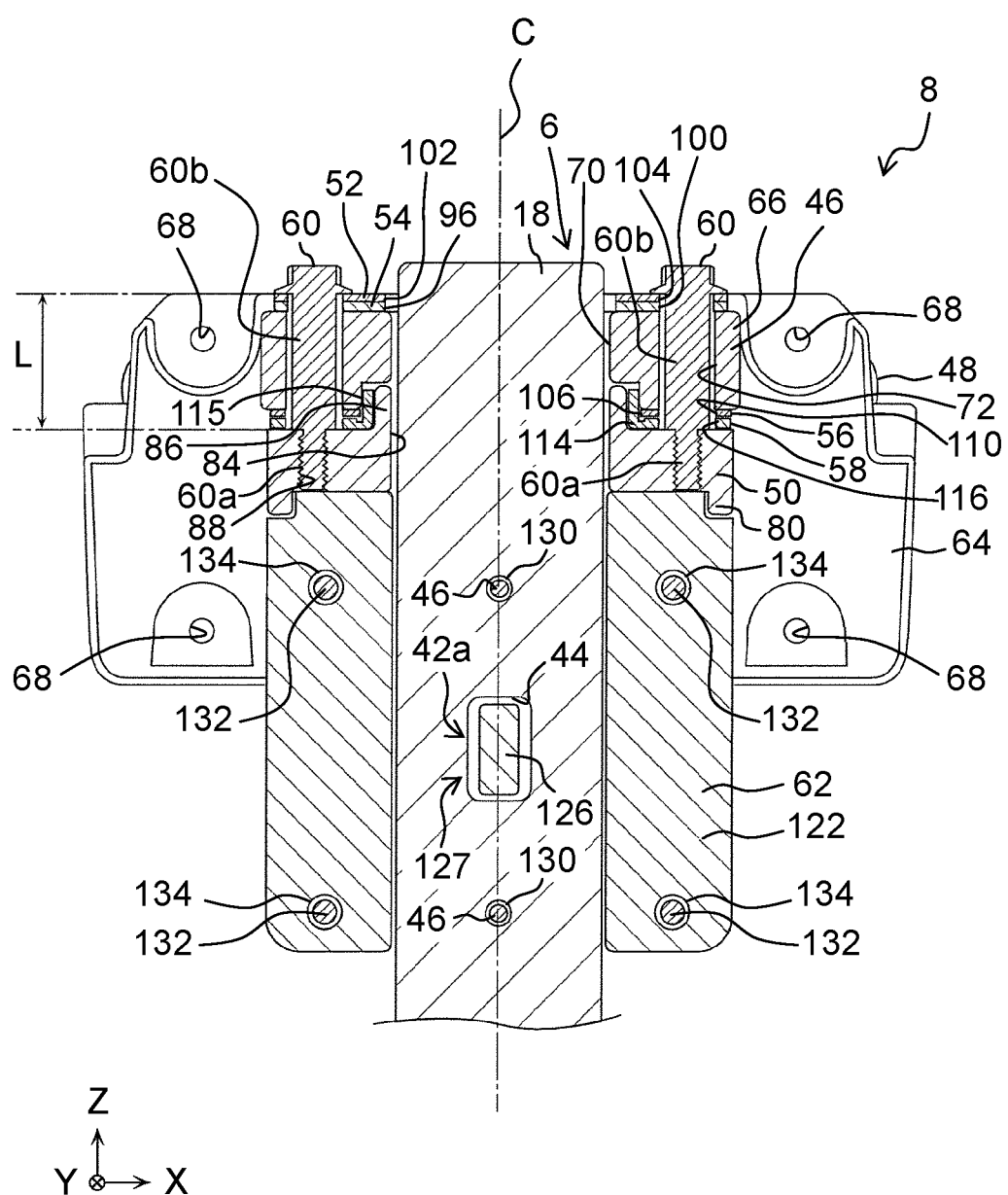
FIG. 7 is a cross-sectional view schematically showing an example of the configuration of the stand and the adjusting mechanism according to the first exemplary embodiment.

FIG. 7 is a cross-sectional view schematically showing an example of the configuration of stand 6 and adjusting mechanism 8 according to the first exemplary embodiment. FIG. 7 shows a cross section taken along line VII-VII of FIG. 3.

Figure 8:
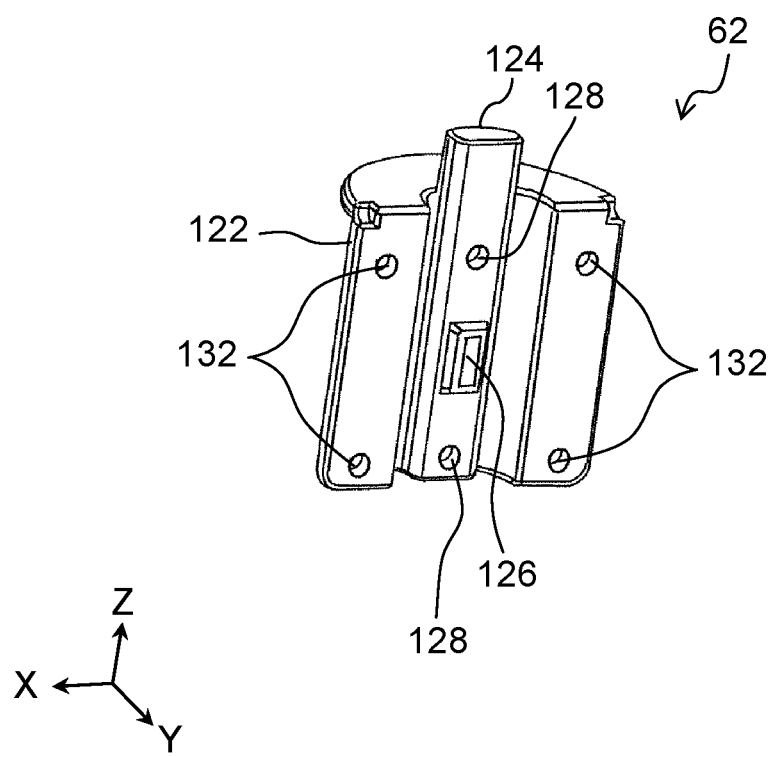
FIG. 8 is a perspective view schematically showing an example of a configuration of a support member in the adjusting mechanism according to the first exemplary embodiment.

FIG. 8 is a perspective view schematically showing an example of a configuration of support member 62 in adjusting mechanism 8 according to the first exemplary embodiment. FIG. 8 shows support member 62 drawn out of adjusting mechanism 8.

Figure 9:
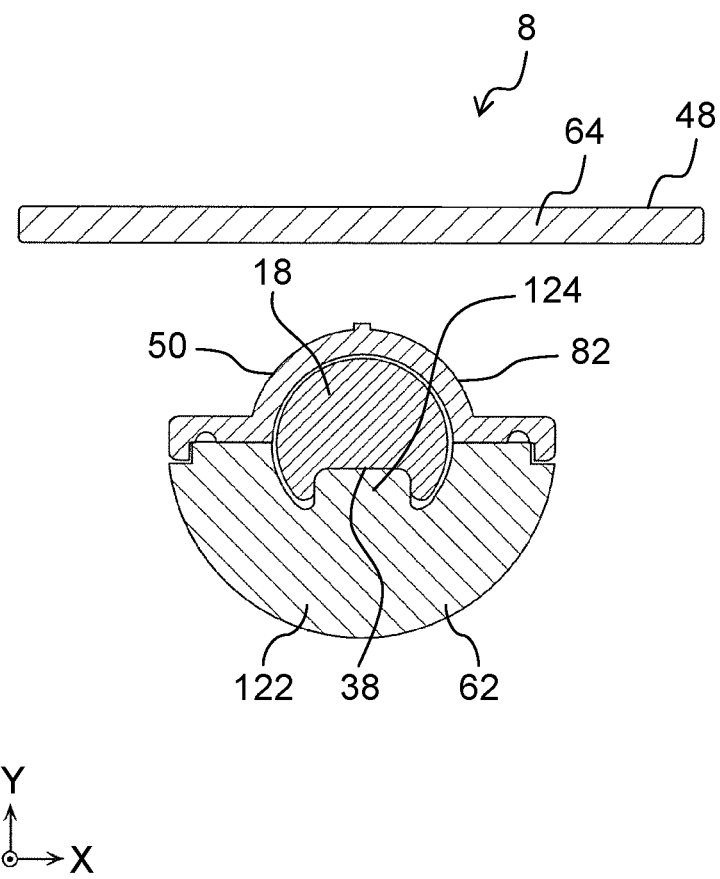
FIG. 9 is a cross-sectional view schematically showing an example of the configuration of the stand and the adjusting mechanism according to the first exemplary embodiment.
Figure 10:
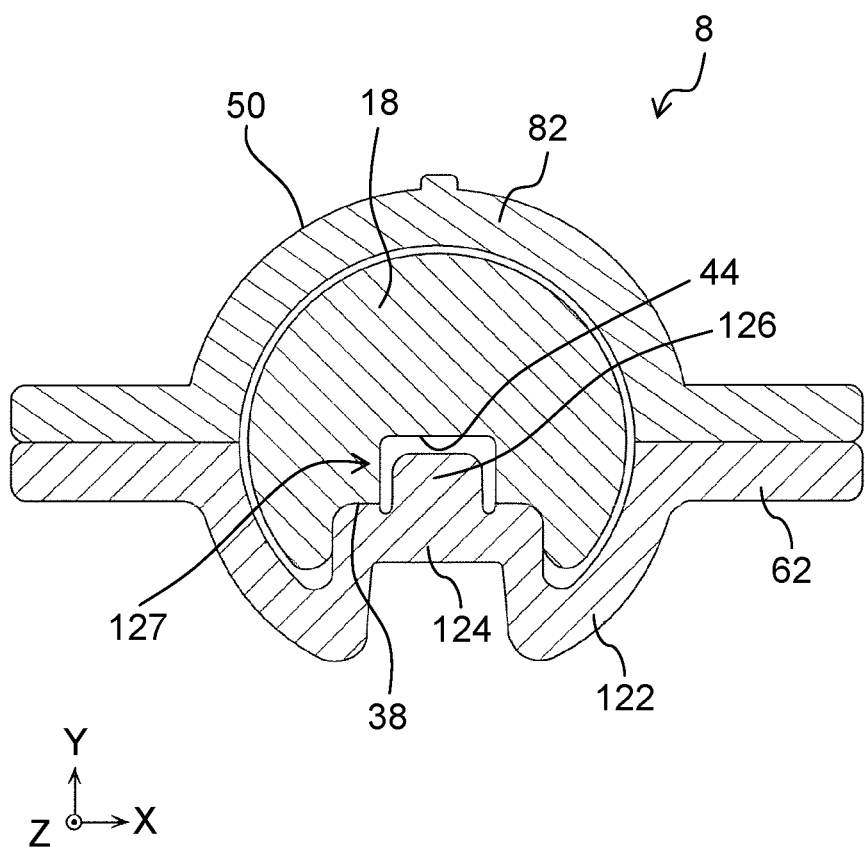
FIG. 10 is a cross-sectional view schematically showing an example of the configuration of the stand and the adjusting mechanism according to the first exemplary embodiment.
Figure 11:
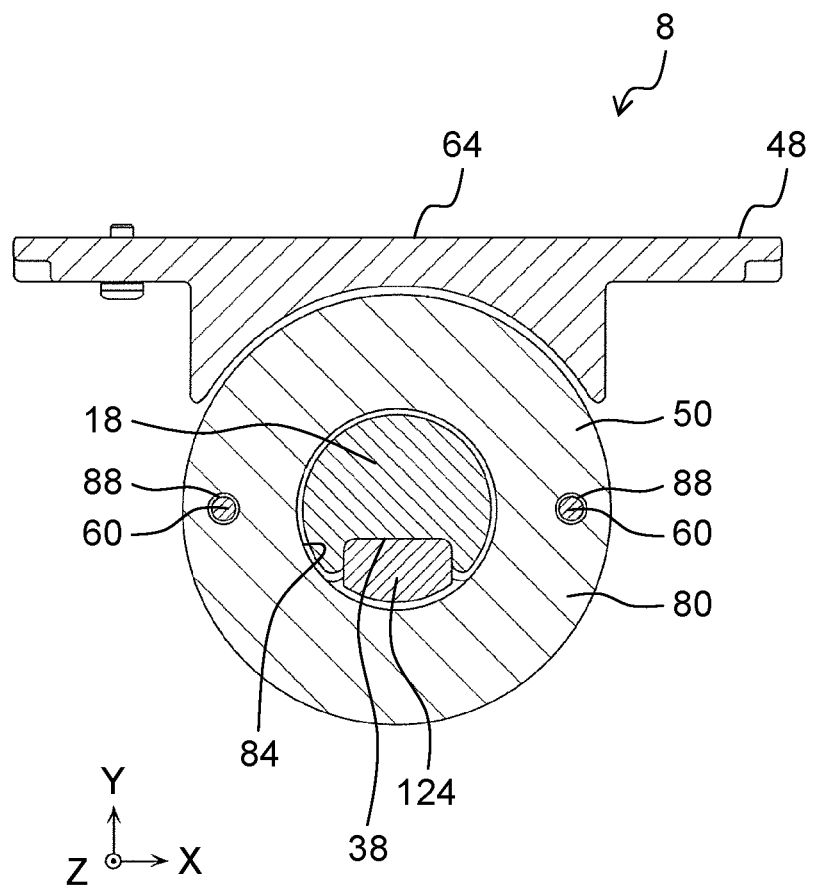
FIG. 11 is a cross-sectional view schematically showing an example of the configuration of the stand and the adjusting mechanism according to the first exemplary embodiment.

FIGS. 9, 10, and 11 are each a cross-sectional view schematically showing an example of the configuration of stand 6 and adjusting mechanism 8 according to the first exemplary embodiment. FIG. 9 shows a cross section taken along line IX-IX of FIG. 3. FIG. 10 shows a cross section taken along line X-X of FIG. 3. FIG. 11 shows a cross section taken along line XI-XI of FIG. 3.

As shown in FIGS. 3, 5, and 6, adjusting mechanism 8 includes attachment member 48, turning member 50, metallic washer 52, resin washer 54, resin washer 56, resin washer 58, a pair of shoulder bolts 60, and support member 62.

Attachment member 48 is a component attached to mounting bracket 14 on display unit 4. Attachment member 48 is, for example, formed from a metal such as die-cast aluminum. As shown in FIGS. 3, 5, and 6, attachment member 48 has attachment part 64 and support part 66.

Attachment part 64 is formed into a substantially rectangular plate shape when viewed along a front-rear direction (the Y-axis direction). Attachment part 64 has a plurality of (e.g., four) through holes 68. Through holes 68 are formed in respective four corners of attachment part 64. As shown in FIG. 2, the plurality of (e.g., four) bolts 20 is screwed into the plurality of (e.g., four) bolt holes 12 of mounting bracket 14 through the plurality of (e.g., four) through holes 68 of attachment part 64, respectively, so that attachment member 48 is fastened to mounting bracket 14.

Support part 66 is disposed substantially perpendicular to attachment part 64 (virtually parallel to the X-Y plane) so as to protrude rearward (in the negative Y-direction) from a rear (a surface on the negative Y-direction side) of attachment part 64. Support part 66 is formed into a ring shape when viewed along the vertical direction (the Z-axis direction). A central portion of support part 66 forms opening 70 through which prop part 18 is inserted and movable along axis C (in the Z-axis direction). The opening is circular when viewed along the vertical direction (the Z-axis direction). Support part 66 has a pair of guide openings 72 through which the pair of shoulder bolts 60 passes. The pair of guide openings 72 is disposed at positions substantially symmetric with respect to opening 70 (virtually symmetric with respect to the Y-Z plane running through a middle of opening 70), and is each shaped into an arc being centered on opening 70 and extending along a circumferential direction of opening 70. Thus, shoulder bolts 60 passing through guide openings 72 can move inside guide openings 72 along a circumferential direction of guide openings 72 (i.e., along the circumferential direction of opening 70). This configuration allows support part 66 to turn along the circumferential direction of opening 70 while being guided by shoulder bolts 60 that pass through guide openings 72 and that are fastened to base part 80 of turning member 50. As a result, attachment member 48 can turn relative to turning member 50.

As shown in FIG. 5, a pair of positioning recesses 74 is formed on a top face (a surface on the positive Z-direction side) of support part 66. The pair of positioning recesses 74 is disposed at positions substantially symmetric with respect to opening 70 (virtually symmetric with respect to the X-Z plane running through a middle of opening 70). Positioning recesses 74 are formed by depressing the top face of support part 66 downward (in the negative Z-direction). As shown in FIG. 6, a pair of positioning recesses 76 is formed on a bottom face (a surface on the negative Z-direction side) of support part 66. Positioning recesses 76 each has a circular shape when viewed along the vertical direction (the Z-axis direction). The pair of positioning recesses 76 is disposed at positions substantially symmetric with respect to opening 70 (virtually symmetric with respect to a middle of opening 70). Positioning recesses 76 are formed by depressing the bottom face of support part 66 upward (in the positive Z-direction).

On the bottom face (the surface on the negative Z-direction side) of support part 66, turning regulating recess 78 is also formed to regulate turning. Turning regulating recess 78 is shaped into an arc being centered on opening 70 and extending along the circumferential direction of opening 70. Turning regulating recess 78 is a recess that is formed by depressing the bottom face of support part 66 upward (in the positive Z-direction). On a top face (a surface on the positive Z-direction side) of base part 80 of turning member 50, turning regulating projection 92 (see FIG. 5) designed to regulate turning is formed so as to protrude upward (in the positive Z-direction). Turning regulating projection 92 is inserted into turning regulating recess 78 such that turning regulating projection 92 is movable. Thus, turning regulating projection 92 can move inside turning regulating recess 78 along a circumferential direction of turning regulating recess 78 (i.e., along the circumferential direction of opening 70). This configuration enables attachment member 48 to turn relative to turning member 50 within a range in which turning regulating projection 92 is allowed to move inside turning regulating recess 78.

Turning member 50 is a component that is connected with attachment member 48 and that allows attachment member 48 to turn. Turning member 50 is, for example, formed from a metal such as die-cast aluminum. As shown in FIGS. 5 and 6, turning member 50 has base part 80 and side wall part 82.

Base part 80 is formed into a ring shape when viewed along the vertical direction (the Z-axis direction). A central portion of base part 80 forms opening 84 through which prop part 18 is inserted and movable along axis C (in the Z-axis direction). Opening 84 is circular when viewed along the vertical direction (the Z-axis direction). On a periphery of opening 84, cylindrical support tube part 86 is formed. Support tube part 86 protrudes upward (in the positive Z-direction). As shown in FIG. 5, base part 80 has a pair of bolt holes 88 formed in its top face (the surface on the positive Z-direction side) so that the pair of shoulder bolts 60 is screwed into bolt holes 88. The pair of bolt holes 88 is disposed at positions substantially symmetric with respect to opening 84 (virtually symmetric with respect to the Y-Z plane running through a middle of opening 84). On the top face of base part 80, a pair of positioning recesses 90 is formed. The pair of positioning recesses 90 is disposed at positions substantially symmetric with respect to opening 84 (virtually symmetric with respect to a middle of opening 84). Positioning recesses 90 are formed by depressing the top face of base part 80 downward (in the negative Z-direction). In FIG. 5, one of positioning recesses 90 is hidden behind support tube part 86 and is hence not illustrated. As described above, turning regulating projection 92 is formed on the top face of base part 80 so as to protrude upward (in the positive Z-direction).

Side wall part 82 has a shape that is compatible with that of an outer peripheral front (a surface on the positive Y-direction side) of prop part 18, extending downward (in the negative Z-direction) from a bottom face (a surface on the negative Z-direction side) of base part 80, side wall part 82 has a substantially semicylindrical part that protrudes forward (in the positive Y-direction) when viewed along the vertical direction (the Z-axis direction). Turning member 50 is disposed at a front (a surface on the positive Y-direction side) of prop part 18 such that a recessed face (a surface on the negative Y-direction side) of side wall part 82 covers the outer peripheral front (the surface on the positive Y-direction side) of prop part 18.

Side wall part 82 has lateral parts 82a projecting from left and right ends of the semicylindrical part laterally (in a negative X-direction and a positive X-direction). Lateral parts 82a are substantially rectangular when viewed along the front-rear direction (the Y-axis direction). Lateral parts 82a each have a plurality of (e.g., two) bolt holes 94. In the present exemplary embodiment, in one example, a configuration in which lateral parts 82a of side wall part 82 have four bolt holes 94 in total is shown.

Resin washer 54 is formed into a ring shape when viewed along the vertical direction (the Z-axis direction) and is formed from a synthetic resin such as a polyacetal (POM). As shown in FIGS. 5 to 7, resin washer 54 is disposed on the top face (the surface on the positive Z-direction side) of support part 66 of attachment member 48 and is put between a bottom face (a surface on the negative Z-direction side) of metallic washer 52 and the top face (the surface on the positive Z-direction side) of support part 66. A central portion of resin washer 54 forms opening 96 through which prop part 18 is inserted and movable along axis C (in the Z-axis direction). Opening 96 is circular when viewed along the vertical direction (the Z-axis direction). As shown in FIG. 6, a bottom face (a surface on the negative Z-direction side) of resin washer 54 has a pair of positioning projections 98 protruding downward (in the negative Z-direction). The pair of positioning projections 98 is fitted into the pair of positioning recesses 74 formed on the top face (the surface on the positive Z-direction side) of support part 66. Thus, resin washer 54 on the top face (the surface on the positive Z-direction side) of support part 66 is anchored at a position defined by positioning recesses 74 and projections 98 such that resin washer 54 is kept from turning relative to support part 66. As a result, when support part 66 of attachment member 48 turns, resin washer 54 turns together with support part 66 relative to turning member 50.

Resin washer 54 has a pair of guide openings 100 through which the pair of shoulder bolts 60 passes. The pair of guide openings 100 is disposed at positions substantially symmetric with respect to opening 96 (virtually symmetric with respect to the Y-Z plane running through a middle of opening 96), and is each shaped into an arc being centered on opening 96 and extending along a circumferential direction of opening 96. Thus, shoulder bolts 60 passing through guide openings 100 can move inside guide openings 100 along a circumferential direction of guide openings 100 (i.e., along the circumferential direction of opening 96). This configuration allows resin washer 54 together with support part 66 of attachment member 48 to turn relative to turning member 50.

Metallic washer 52 is formed into a ring shape when viewed along the vertical direction (the Z-axis direction) and is formed from a metal such as SPCC (steel plate cold commercial: cold rolled steel plate). As shown in FIGS. 5 to 7, metallic washer 52 is disposed on a top face (a surface on the positive Z-direction side) of resin washer 54. A central portion of metallic washer 52 forms opening 102 through which prop part 18 is inserted and movable along axis C (in the Z-axis direction). Opening 102 is circular when viewed along the vertical direction (the Z-axis direction). Metallic washer 52 has a pair of through holes 104 through which the pair of shoulder bolts 60 passes. The pair of through holes 104 each has a size that is satisfactory for shoulder bolt 60 to pass through and is formed into a circular shape when viewed along the vertical direction (the Z-axis direction). Through holes 104 are disposed at positions substantially symmetric with respect to opening 102 (virtually symmetric with respect to the Y-Z plane running through a middle of opening 102). Metallic washer 52 is anchored in disposition relative to base part 80 by shoulder bolts 60 passing through the pair of through holes 104 and being fastened to base part 80 of turning member 50. In other words, metallic washer 52 is kept from turning relative to base part 80. As a result, when resin washer 54 disposed on the bottom face (the surface on the negative Z-direction side) of metallic washer 52, together with support part 66 of attachment member 48, turns relative to turning member 50, resin washer 54 turns relative to metallic washer 52.

Resin washer 56 is formed into a ring shape when viewed along the vertical direction (the Z-axis direction) and is formed from a synthetic resin such as a polyacetal. As shown in FIGS. 5 to 7, resin washer 56 is disposed on the bottom face (the surface on the negative Z-direction side) of support part 66 of attachment member 48 and is put between a top face (a surface on the positive Z-direction side) of resin washer 58 and the bottom face (the surface on the negative Z-direction side) of support part 66. A central portion of resin washer 56 forms opening 106 through which prop part 18 is inserted and movable along axis C (in the Z-axis direction). Opening 106 is circular when viewed along the vertical direction (the Z-axis direction). As shown in FIG. 5, a top face (a surface on the positive Z-direction side) of resin washer 56 has a pair of positioning projections 108 protruding upward (in the positive Z-direction). The pair of positioning projections 108 is fitted into the pair of positioning recesses 76 formed on the bottom face (the surface on the negative Z-direction side) of support part 66. Thus, resin washer 56 on the bottom face (the surface on the negative Z-direction side) of support part 66 is anchored at a position defined by positioning recesses 76 and positioning projections 108 such that resin washer 56 is kept from turning relative to support part 66. As a result, when support part 66 of attachment member 48 turns, resin washer 56 turns together with support part 66 relative to turning member 50.

Resin washer 56 has a pair of guide openings 110 through which the pair of shoulder bolts 60 passes. The pair of guide openings 110 is disposed at positions substantially symmetric with respect to opening 106 (virtually symmetric with respect to the Y-Z plane running through a middle of opening 106), and is each shaped into an arc being centered on opening 106 and extending along a circumferential direction of opening 106. Thus, shoulder bolts 60 passing through guide openings 110 can move inside guide openings 110 along a circumferential direction of guide openings 110

(i.e., along the circumferential direction of opening 106). This configuration allows resin washer 56 together with support part 66 of attachment member 48 to turn relative to turning member 50.

In resin washer 56, turning regulating opening 112 is formed. Turning regulating opening 112 is shaped into an arc being centered on opening 106 and extending along the circumferential direction of opening 106. On the top face (the surface on the positive Z-direction side) of base part 80 of turning member 50, turning regulating projection 92 designed to regulate turning is formed so as to protrude upward (in the positive Z-direction). Turning regulating projection 92 is inserted into turning regulating opening 112 such that turning regulating projection 92 is movable. Turning regulating projection 92 passing through turning regulating opening 112 from the bottom to the top (in the positive Z-direction) is inserted into turning regulating recess 78 formed on the bottom face (the surface on the negative Z-direction side) of support part 66 such that turning regulating projection 92 is movable. Thus, turning regulating projection 92 can move inside turning regulating opening 112 along a circumferential direction of turning regulating opening 112 (i.e., along the circumferential direction of opening 106). This configuration enables resin washer 56 together with support part 66 of attachment member 48 to turn relative to turning member 50 within a range in which turning regulating projection 92 is allowed to move inside turning regulating recess 78.

Resin washer 58 is formed into a ring shape when viewed along the vertical direction (the Z-axis direction) and is formed from a synthetic resin such as an acrylonitrile butadiene styrene (ABS) resin. As shown in FIGS. 5 to 7, resin washer 58 is disposed on the top face (the surface on the positive Z-direction side) of base part 80 of turning member 50 and is put between a bottom face (a surface on the negative Z-direction side) of resin washer 56 and the top face (the surface on the positive Z-direction side) of base part 80. In other words, resin washers 56 and 58 laid on top of each other are put between the bottom face (the surface on the negative Z-direction side) of support part 66 of attachment member 48 and the top face (the surface on the positive Z-direction side) of base part 80 of turning member 50.

A central portion of resin washer 58 forms opening 114 through which prop part 18 is inserted and movable along axis C (in the Z-axis direction). Opening 114 is circular when viewed along the vertical direction (the Z-axis direction). On a periphery of opening 114, cylindrical support tube part 115 is formed. Support tube 115 protrudes upward (in the positive Z-direction). Support tube part 115 is put between a circumference of opening 106 of resin washer 56 and an outer peripheral surface of support tube part 86 on base part 80. Resin washer 58 has a pair of through holes 116 through which the pair of shoulder bolts 60 passes. The pair of through holes 116 each has a size that is satisfactory for shoulder bolt 60 to pass through and is formed into a circular shape when viewed along the vertical direction (the Z-axis direction). Through holes 116 are disposed at positions substantially symmetric with respect to opening 114 (virtually symmetric with respect to the Y-Z plane running through a middle of opening 114).

As shown in FIG. 6, a bottom face (a surface on the negative Z-direction side) of resin washer 58 has a pair of positioning projections 118 protruding downward (in the negative Z-direction). The pair of positioning projections 118 is fitted into the pair of positioning recesses 90 formed on the top face (the surface on the positive Z-direction side) of base part 80. Thus, resin washer 58 on the top face (the surface on the positive Z-direction side) of base part 80 is anchored at a position defined by positioning recesses 90 and positioning projections 118 such that resin washer 58 is kept from turning relative to base part 80. As a result, when resin washer 56 disposed on the top face (the surface on the positive Z-direction side) of resin washer 58 turns together with support part 66 of attachment member 48 relative to turning member 50, resin washer 56 turns relative to resin washer 58.

In resin washer 58, turning regulating opening 120 is formed. On the top face (the surface on the positive Z-direction side) of base part 80 of turning member 50, turning regulating projection 92 is formed so as to protrude upward (in the positive Z-direction). Turning regulating projection 92 is inserted into turning regulating opening 120. Since turning regulating projection 92 does not move inside turning regulating opening 120, turning regulating opening 120 has a size that is satisfactory for turning regulating projection 92 to pass through. Passing through turning regulating opening 120 from the bottom to the top (in the positive Z-direction), turning regulating projection 92 passes through turning regulating opening 112 of resin washer 56 and is inserted into turning regulating recess 78 formed on the bottom face (the surface on the negative Z-direction side) of support part 66 such that turning regulating projection 92 is movable.

Shoulder bolts 60 are fastening members used to fasten attachment member 48 to turning member 50 such that support part 66 of attachment member 48 is movable relative to base part 80 of turning member 50. As shown in FIGS. 5 to 7, the pair of shoulder bolts 60 is screwed into the pair of bolt holes 88 formed in base part 80 of turning member 50 through the pair of through holes 104 formed in metallic washer 52, the pair of guide openings 100 formed in resin washer 54, the pair of guide openings 72 formed in support part 66 of attachment member 48, the pair of guide openings 110 formed in resin washer 56, and the pair of through holes 116 formed in resin washer 58, respectively.

According to the configuration described above, metallic washer 52 and resin washer 58 are kept from turning relative to base part 80 of turning member 50 (i.e., they do not turn relative to base part 80). Meanwhile, resin washer 54, support part 66 of attachment member 48, and resin washer 56 are permitted to turn relative to base part 80 (i.e., they can turn relative to base part 80). As a result, resin washer 54, support part 66 of attachment member 48, and resin washer 56 can turn as an integral whole relative to base part 80 of turning member 50 and resin washer 58. Turning of these parts is confined to a range in which turning regulating projection 92 is allowed to move inside turning regulating recess 78.

As shown in FIG. 7, shoulder bolt 60 includes shank portion 60a that is threaded and large-diameter portion 60b that is larger in diameter than shank portion 60a. Shank portions 60a are screwed into bolt holes 88 in base part 80. Length L of large-diameter portion 60b in an axial direction (in the Z-axis direction) is shorter (e.g., about 0.5 mm shorter) than a sum of thicknesses (sizes in the Z-axis direction) of metallic washer 52, resin washer 54, support part 66, resin washer 56, and resin washer 58. Shoulder bolts 60 thus configured allow themselves to be screwed into bolt holes 88 with a substantially constant tightening torque so that metallic washer 52, resin washer 54, support part 66, resin washer 56, and resin washer 58 can be fastened to base part 80 with substantially constant force.

Support member 62 is a component that is fastened to prop part 18 and turning member 50 to support turning member 50 with prop part 18. As shown in FIGS. 3, 5, 6, and 8, support member 62 includes support body part 122 and protrusion part 124.

Support body part 122 has a shape that is compatible with that of an outer peripheral rear (a surface on the negative Y-direction side) of prop part 18 and lateral parts 82a of side wall part 82 of turning member 50. Support body part 122 has a substantially semicylindrical part that protrudes rearward (in the negative Y-direction) when viewed along the vertical direction (the Z-axis direction). Support member 62 is disposed at a rear (a surface on the negative Y-direction side) of prop part 18 such that a recessed face (a surface on the positive Y-direction side) of support body part 122 is put over the outer peripheral rear (the surface on the negative Y-direction side) of prop part 18.

As shown in FIG. 8, protrusion part 124 is disposed at a middle of the recessed face (the surface on the positive Y-direction side) of support body part 122 and is long in shape, extending along an axial direction of support body part 122 (the Z-axis direction). A breadth of protrusion part 124 (a size in the X-axis direction) is substantially equal to a breadth of groove portion 38 of prop part 18 (a size in the X-axis direction). This enables protrusion part 124 to be fitted into groove portion 38 of prop part 18. An upper end part of protrusion part 124 (one end part of protrusion part 124, an end part on the positive Z-direction side) protrudes upward (outward of support body part 122 in the positive Z-direction) from an upper end (an end on the positive Z-direction side) of support body part 122. As shown in FIG. 7, the upper end part (the end part on the positive Z-direction side) of protrusion part 124 is inserted into opening 84 of base part 80 from the bottom toward the top (from the negative Z-direction side toward the positive Z-direction side). Thus, as shown in FIG. 9, protrusion part 124 is fitted into groove portion 38 of prop part 18.

As shown in FIG. 8, protrusion part 124 has projection 126 protruding in a direction (the Y-axis direction) substantially perpendicular to the axial direction of support body part 122 (the Z-axis direction). As shown in FIGS. 7 and 10, when protrusion part 124 is fitted into groove portion 38 of prop part 18, projection 126 of protrusion part 124 is fitted into recess 44 in any one of height adjusting portions 42a to 42d of prop part 18. Projection 126 and recess 44 constitute regulating mechanism 127 to preclude display unit 4 from descending (display unit 4 from falling) relative to stand 6 when a plurality of (e.g., a pair of) bolts 130 is removed from a plurality of (e.g., a pair of) bolt holes 46.

As shown in FIGS. 5, 6, and 8, a pair of through holes 128 is formed at a middle of support body part 122 in a left-right direction (at a middle in the X-axis direction). The pair of through holes 128 corresponds with the pairs of bolt holes 46 formed in respective height adjusting portions 42a to 42d of prop part 18. The pair of through holes 128 penetrates through support body part 122 and protrusion part 124 in a thickness direction (the Y-axis direction). The pair of bolts 130 is screwed into the pair of bolt holes 46 formed in any one of height adjusting portions 42a to 42d of prop part 18 (in the example shown in FIGS. 1 to 11, the pair of bolt holes 46 in height adjusting portion 42a) through the pair of through holes 128 formed in support body part 122, so that support member 62 is fastened to prop part 18.

In left and right lateral parts (both lateral parts in the X-axis direction) of support body part 122, a plurality of (e.g., four) through holes 132 is formed. The plurality of through holes 132 corresponds with the plurality of (e.g., four) bolt holes 94 formed in lateral parts 82a of side wall part 82. A plurality of (e.g., four) bolts 134 is screwed into the plurality of (e.g., four) bolt holes 94 in lateral parts 82a of side wall part 82 through the plurality of (e.g., four) through holes 132 of support body part 122, so that support member 62 is fastened to turning member 50.

In this way, prop part 18 supports turning member 50 via support member 62.

As shown in FIG. 9, prop part 18 is clamped between the recessed face (the surface on the negative Y-direction side) of side wall part 82 of turning member 50 and the recessed face (the surface on the positive Y-direction side) of support body part 122 of support member 62. As shown in FIG. 7, prop part 18 is inserted into opening 102 of metallic washer 52, opening 96 of resin washer 54, opening 70 of support part 66, opening 106 of resin washer 56, opening 114 of resin washer 58, and opening 84 of base part 80. This configuration enables display unit 4 attached to attachment member 48 to move up and down relative to stand 6 along axis C of prop part 18 (movable along the Z-axis direction).

The swivel function of adjusting mechanism 8 will now be described. To adjust the orientation of the display screen of display unit 4, a user turns display unit 4 attached to attachment member 48 around axis C of prop part 18 (turns along the X-Y plane) relative to stand 6. As a result, resin washer 54, support part 66 of attachment member 48, and resin washer 56 turn as an integral whole relative to base part 80 of turning member 50 and resin washer 58. In the meantime, a range within which display unit 4 is permitted to turn relative to stand 6 (a range of turning relative to the X-Z plane along the X-Y plane) is confined to a predetermined angular range because turning regulating projection 92 on base part 80 of turning member 50 is designed to come into contact with one end or the other end of turning regulating recess 78 on support part 66 of attachment member 48 in the circumferential direction. In other words, display device 2 regulates the turning of display unit 4 to prevent display unit 4 from turning relative to turning member 50 fastened to prop part 18 of stand 6 beyond a predetermined angular range. The predetermined angular range is, for example, from −15° to +15°.

In adjusting mechanism 8, guide openings 72, 100, 110 are formed such that shoulder bolts 60 screwed into bolt holes 88 in base part 80 of turning member 50 are not put into contact with any of one ends and the other ends of guide openings 100 of resin washer 54, guide openings 72 of support part 66 of attachment member 48, and guide openings 110 of resin washer 56 in the circumferential direction while turning regulating projection 92 is in contact with the one end or the other end of turning regulating recess 78 in the circumferential direction. In adjusting mechanism 8, turning regulating opening 112 is formed such that turning regulating projection 92 is not in contact with any of one end and the other end of turning regulating opening 112 of resin washer 56 in the circumferential direction before turning regulating projection 92 comes into contact with the one end or the other end of turning regulating recess 78 in the circumferential direction.

Adjusting mechanism 8 described above allows display unit 4 to move up or down and turn relative to stand 6 and with respect to a single axis. In other words, an axis along which display unit 4 moves up and down and an axis around which display unit 4 turns relative to stand 6 are identical axis C.

[1-4. Installation Steps for Display Device]

With reference to FIGS. 12A to 12D, steps involved in installing display device 2 on a floor will now be described.

FIGS. 12A to 12D are drawings illustrating steps involved in installing display device 2 according to the first exemplary embodiment.

Figure 12A:
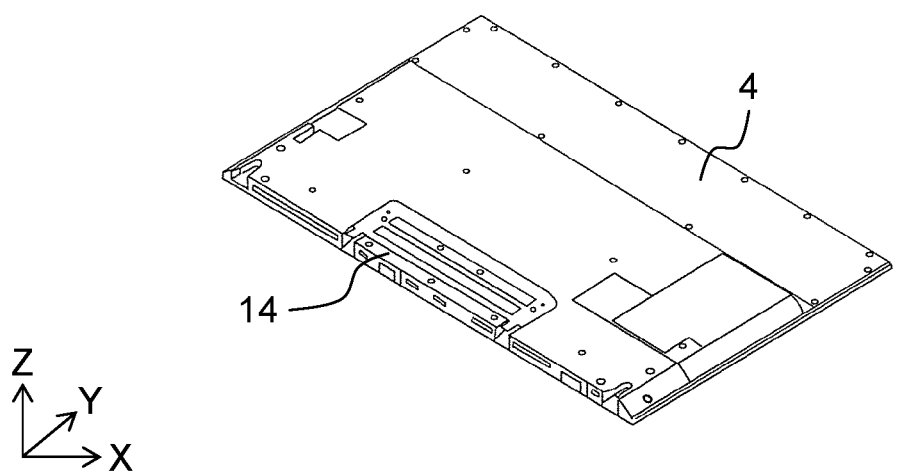
FIG. 12A is a drawing illustrating a step involved in installing the display device according to the first exemplary embodiment.

First, as shown in FIG. 12A, display unit 4 is placed (laid) on the floor (the X-Y plane) such that the display screen faces downward (the negative Z-direction side).

Figure 12B:
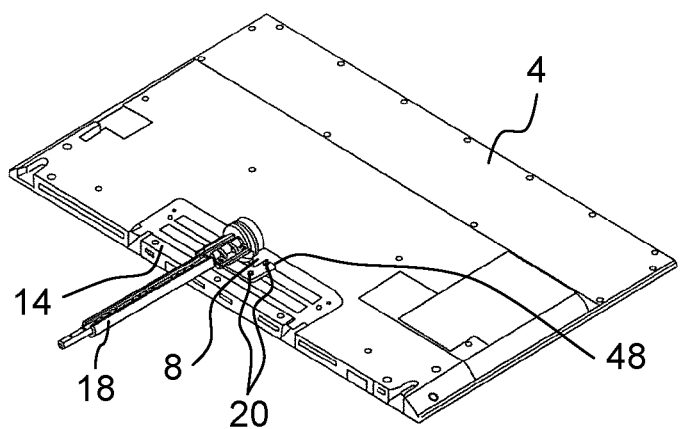
FIG. 12B is a drawing illustrating a step involved in installing the display device according to the first exemplary embodiment.

Next, as shown in FIG. 12B, with display unit 4 placed on the floor, the plurality of (e.g., four) bolts 20 is screwed into the plurality of (e.g., four) bolt holes 12 formed in mounting bracket 14 through the plurality of (e.g., four) through holes 68 formed in attachment member 48 of adjusting mechanism 8, respectively, to fasten attachment member 48 of adjusting mechanism 8 to mounting bracket 14. Supposedly, prop part 18 is already attached to attachment member 48.

Figure 12C:
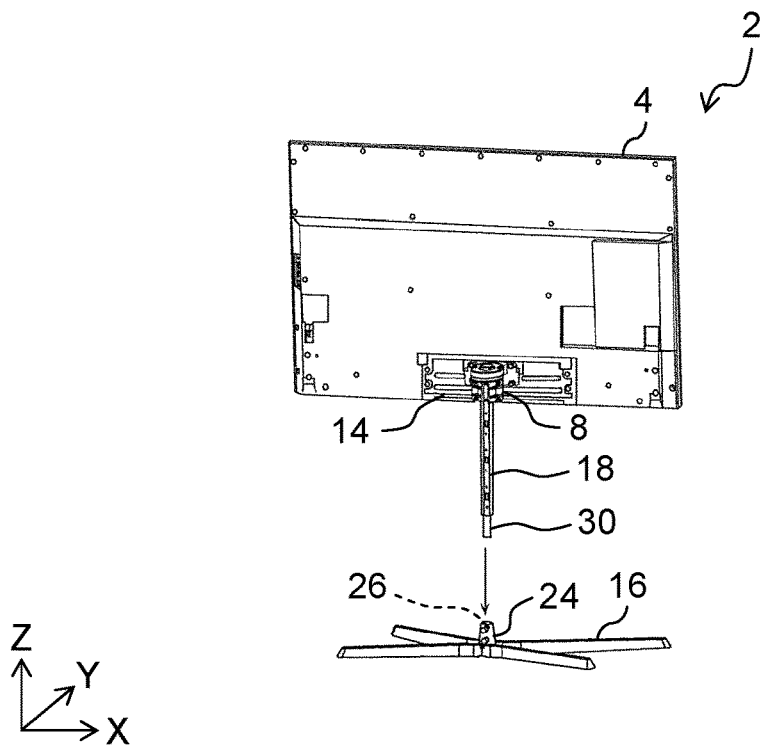
FIG. 12C is a drawing illustrating a step involved in installing the display device according to the first exemplary embodiment.

Next, as shown in FIG. 12C, base member 16 is placed at a spot on the floor (the X-Y plane) where display device 2 is to be installed. Display unit 4 is raised off the floor, and plug portion 30 of prop part 18 is inserted into hole 26 in joint part 24 of base member 16.

Figure 12D:
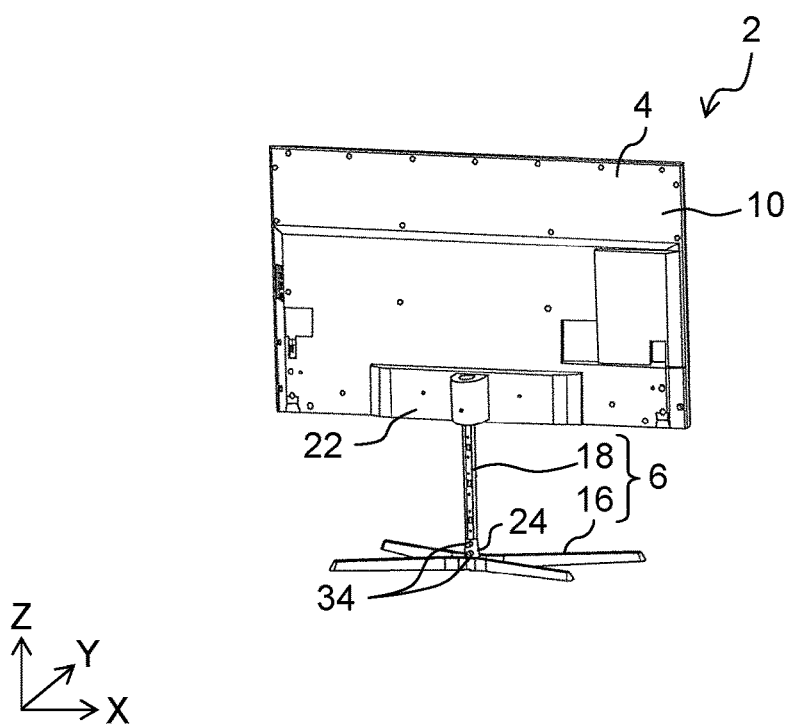
FIG. 12D is a drawing illustrating a step involved in installing the display device according to the first exemplary embodiment.

Next, as shown in FIG. 12D, the plurality of (e.g., two) bolts 34 is screwed into the plurality of (e.g., two) through holes 28 formed in joint part 24 to fasten prop part 18 to base member 16. Lastly, covering member 22 is attached to the rear (the surface on the negative Y-direction side) of housing 10 of display unit 4 so as to cover mounting bracket 14.

By following the steps described above, display device 2 can be installed on the floor.

[1-5. Steps for Adjusting Height of Display Unit]

With reference to FIGS. 13A to 13H, steps involved in adjusting height H (the height in the Z-axis direction) (see FIG. 1) of display unit 4 above the floor will now be described. In display device 2, height H (the height in the Z-axis direction) of display unit 4 above the floor is adjusted using the up-and-down function of adjusting mechanism 8.

FIGS. 13A to 13H are drawings illustrating steps involved in adjusting height H of display unit 4 above the floor in the first exemplary embodiment.

In one example, the following description shows steps for adjusting adjusting mechanism 8 to change the height (the height in the Z-axis direction) of display unit 4 above the floor from a highest level (e.g., a position of height adjusting portion 42a, see FIG. 7) to a lowest level (e.g., a position of height adjusting portion 42d, see FIG. 3). In other words, the following description shows steps involved in shifting support member 62 and turning member 50 fastened to the position of height adjusting portion 42a (see FIG. 7) in prop part 18 to the position of height adjusting portion 42d (see FIG. 3) and fastening the shifted components to prop part 18.

Figure 13A:
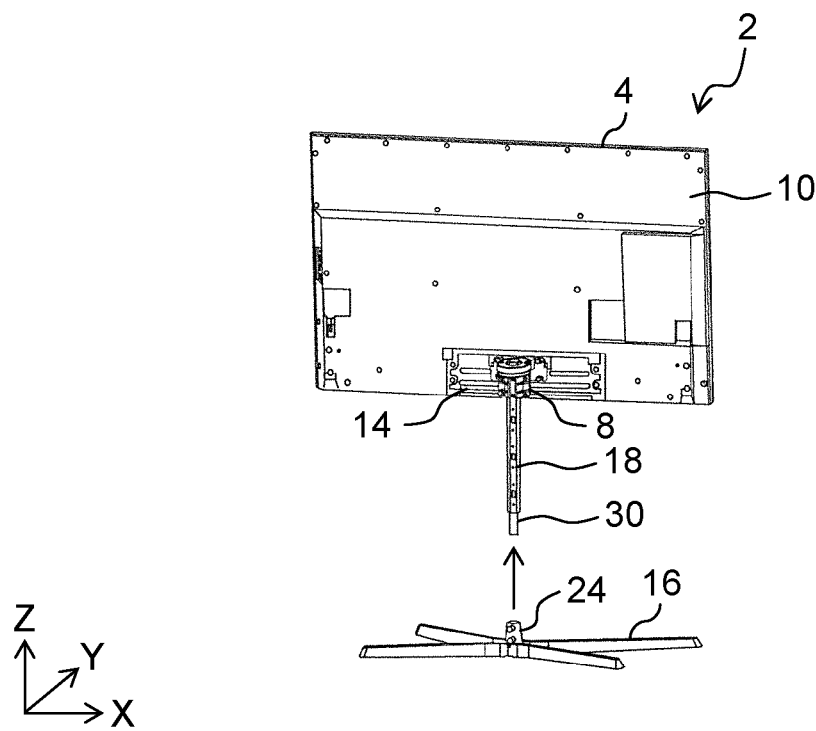
FIG. 13A is a drawing illustrating a step involved in adjusting a height of a display unit above a floor in the first exemplary embodiment.

First, as shown in FIG. 13A, covering member 22 is detached from the rear (the surface on the negative Y-direction side) of housing 10 of display unit 4. Prop part 18 is dismounted from base member 16 by being held up (in the positive Z-direction).

Figure 13B:
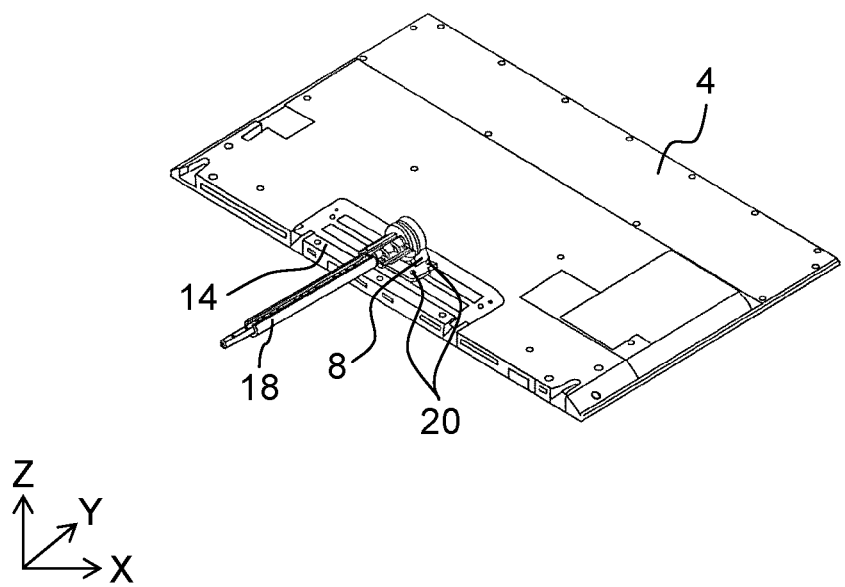
FIG. 13B is a drawing illustrating a step involved in adjusting the height of the display unit above the floor in the first exemplary embodiment.

Next, as shown in FIG. 13B, display unit 4 is placed (laid) on the floor (the X-Y plane) such that the display screen faces downward (the negative Z-direction side).

Figure 13C:
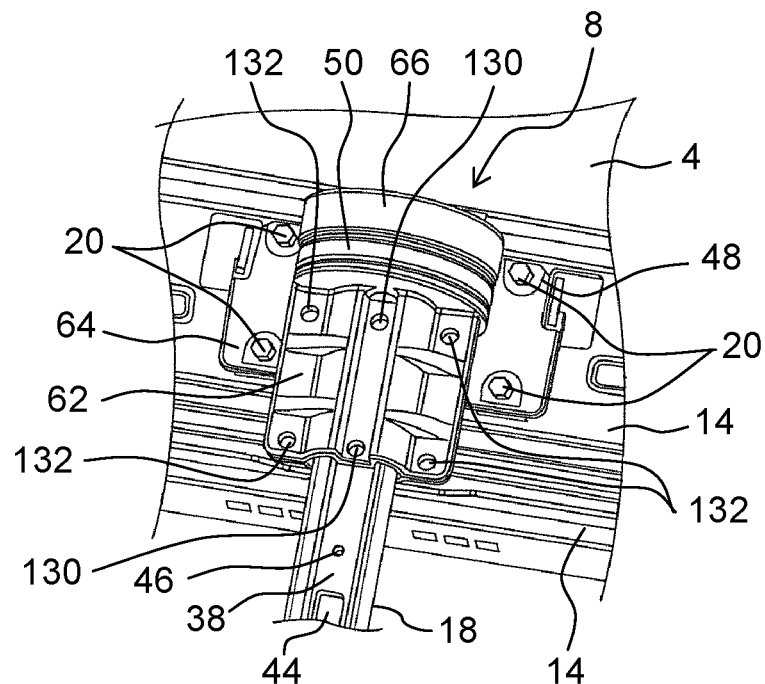
FIG. 13C is a drawing illustrating a step involved in adjusting the height of the display unit above the floor in the first exemplary embodiment.

Next, as shown in FIG. 13C, with display unit 4 placed on the floor, the plurality of (e.g., four) bolts 134 (see FIGS. 5 and 6) is unscrewed from the plurality of (e.g., four) bolt holes 94 of turning member 50 (see FIGS. 5 and 6), and is removed from the plurality of (e.g., four) through holes 132 of support member 62. This puts adjusting mechanism 8 into a state in which prop part 18 and support member 62 can be removed from turning member 50. At this point in time, support member 62 is fastened to the position of height adjusting portion 42a in prop part 18. Then, prop part 18 and support member 62 are removed from turning member 50.

Turning member 50 at this moment remains fastened to mounting bracket 14 on display unit 4.

Figure 13D:
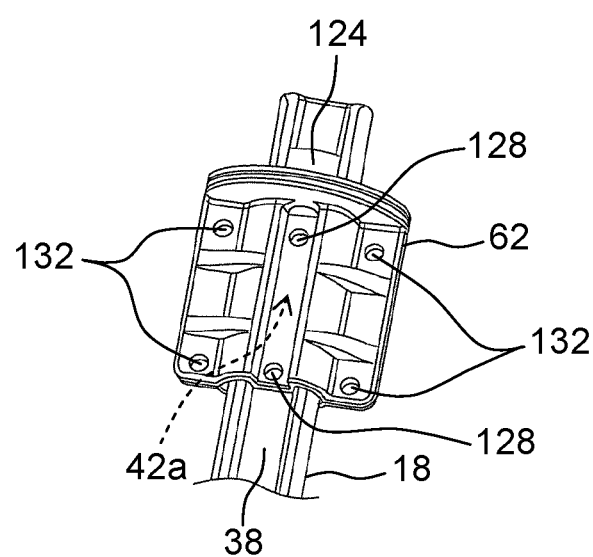
FIG. 13D is a drawing illustrating a step involved in adjusting the height of the display unit above the floor in the first exemplary embodiment.

Next, as shown in FIG. 13D, the pair of bolts 130 is unscrewed from the pair of bolt holes 46 formed in height adjusting portion 42a of prop part 18, and is removed from the pair of through holes 128 of support member 62. This puts adjusting mechanism 8 into a state in which support member 62 can be removed from prop part 18. Then, support member 62 is removed from height adjusting portion 42a of prop part 18.

Figure 13E:
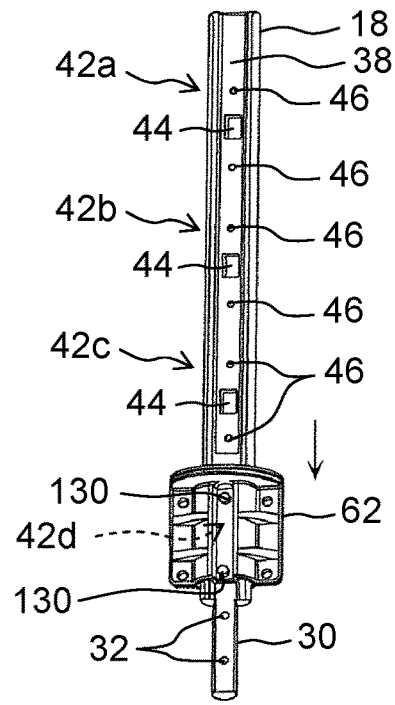
FIG. 13E is a drawing illustrating a step involved in adjusting the height of the display unit above the floor in the first exemplary embodiment.

Next, as shown in FIG. 13E, support member 62 is shifted from the position of height adjusting portion 42a to the position of height adjusting portion 42d in prop part 18. Then, protrusion part 124 of support member 62 is fitted into groove portion 38 of prop part 18, and projection 126 (see FIG. 8) of support member 62 is fitted into recess 44 in height adjusting portion 42d of prop part 18. In this state, the pair of bolts 130 is screwed into the pair of bolt holes 46 in height adjusting portion 42d of prop part 18 through the pair of through holes 128 of support member 62. Thus, support member 62 is fastened to the position of height adjusting portion 42d in prop part 18.

Figure 13F:
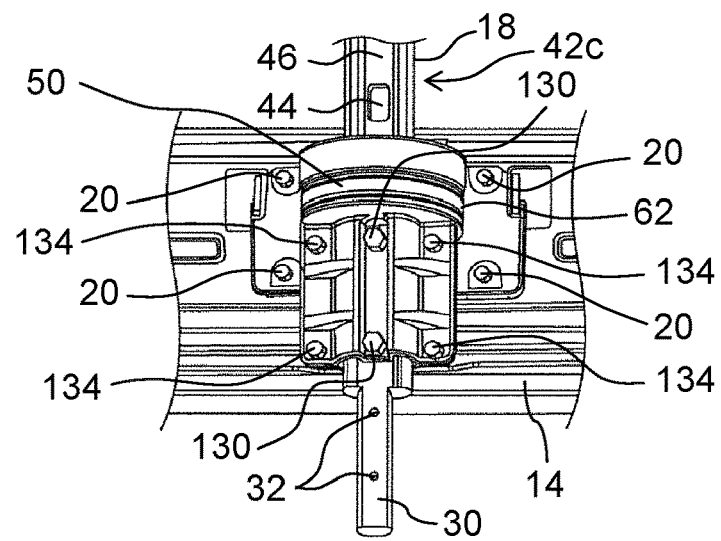
FIG. 13F is a drawing illustrating a step involved in adjusting the height of the display unit above the floor in the first exemplary embodiment.

Next, as shown in FIG. 13F, with display unit 4 placed on the floor (the X-Y plane), the plurality of (e.g., four) bolts 134 is screwed into the plurality of (e.g., four) bolt holes 94 (see FIGS. 5 and 6) of turning member 50 through the plurality of (e.g., four) through holes 132 of support member 62. In this way, support member 62 fastened to the position of height adjusting portion 42d in prop part 18 is fastened to turning member 50 fastened to mounting bracket 14 on display unit 4.

Figure 13G:
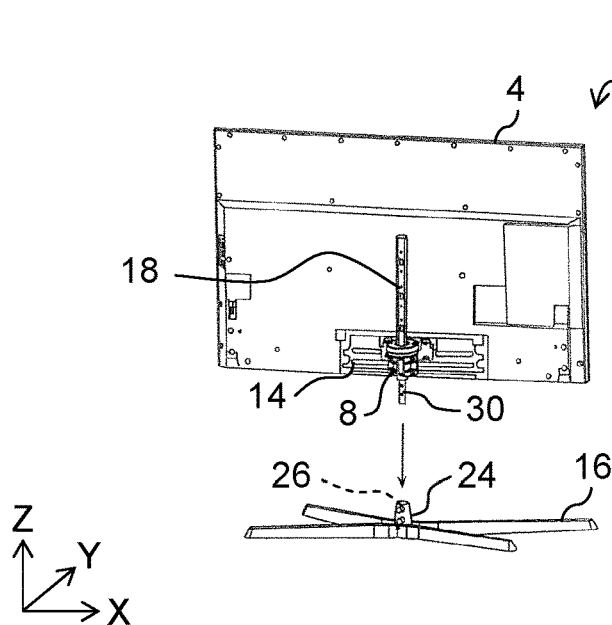
FIG. 13G is a drawing illustrating a step involved in adjusting the height of the display unit above the floor in the first exemplary embodiment.

Next, as shown in FIG. 13G, display unit 4 is raised off the floor, and plug portion 30 of prop part 18 is inserted into hole 26 in joint part 24 of base member 16.

Figure 13H:
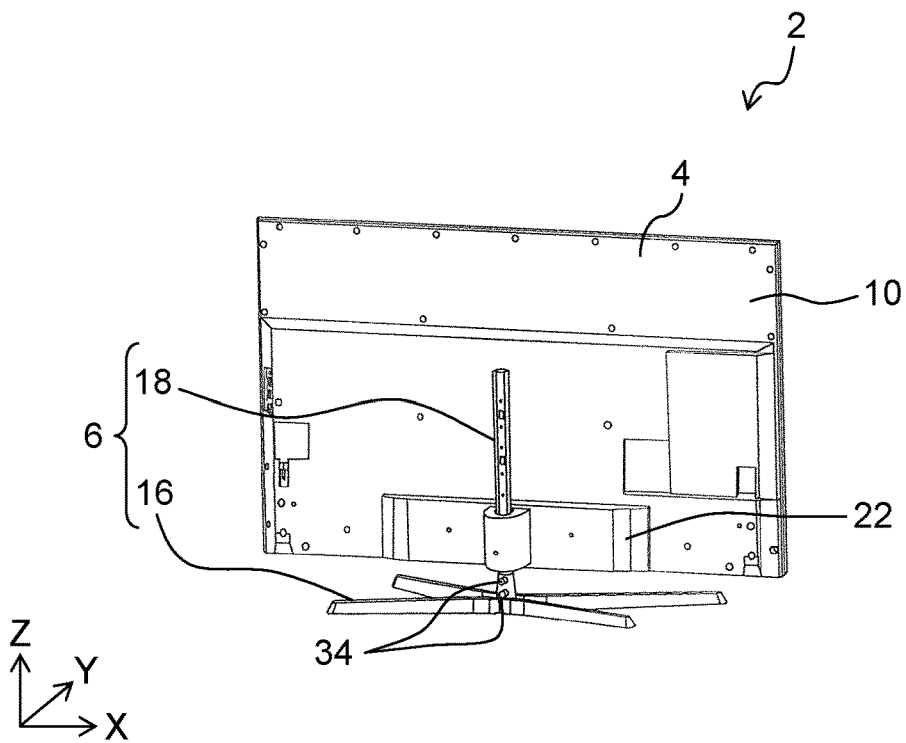
FIG. 13H is a drawing illustrating a step involved in adjusting the height of the display unit above the floor in the first exemplary embodiment.

Next, as shown in FIG. 13H, the plurality of (e.g., two) bolts 34 is screwed into the plurality of (e.g., two) through holes 28 formed in joint part 24 to fasten prop part 18 to base member 16. Lastly, covering member 22 is attached to the rear (the surface on the negative Y-direction side) of housing 10 of display unit 4 so as to cover mounting bracket 14.

In display device 2, height H of display unit 4 above the floor can be adjusted through the steps described above. In display device 2 according to the present exemplary embodiment, height H of display unit 4 above the floor can be adjusted in four levels by attaching support member 62 to any of height adjusting portions 42a to 42d.

Specifically, in display device 2, if support member 62 is attached to the position of height adjusting portion 42a in prop part 18, height H (the height in the Z-axis direction) of display unit 4 above the floor reaches a highest level. In other words, display unit 4 is disposed at a highest place on prop part 18. If support member 62 is attached to the position of height adjusting portion 42b in prop part 18, height H of display unit 4 above the floor reaches a second highest level. In other words, display unit 4 is disposed at a second highest place on prop part 18. If support member 62 is attached to the position of height adjusting portion 42c in prop part 18, height H of display unit 4 above the floor reaches a third highest level. In other words, display unit 4 is disposed at a third highest place on prop part 18. If support member 62 is attached to the position of height adjusting portion 42d in prop part 18, height H of display unit 4 above the floor reaches a fourth highest level. In other words, display unit 4 is disposed at a lowest place on prop part 18.

[1-6. Effects and Others]

As described above, a display device according to the present exemplary embodiment includes a display unit shaped like a panel, a stand to support the display unit, an adjusting mechanism being attached to the display unit and enabling the display unit to move up and down relative to the stand and turn around the stand, a first fastening member to fasten the adjusting mechanism to the stand, and a regulating mechanism to regulate the display unit from descending relative to the stand when the first fastening member is removed. The regulating mechanism includes a projection formed on one of the stand and the adjusting mechanism, and a recess being formed in the other of the stand and the adjusting mechanism and being fitted onto the projection.

A stand set according to the present exemplary embodiment includes a stand to support a display unit shaped like a panel, an adjusting mechanism being attached to the display unit and enabling the display unit to move up and down relative to the stand and turn around the stand, a first fastening member to fasten the adjusting mechanism to the stand, and a regulating mechanism to regulate the display unit from descending relative to the stand when the first fastening member is removed. The regulating mechanism includes a projection formed on one of the stand and the adjusting mechanism, and a recess being formed in the other of the stand and the adjusting mechanism and being fitted onto the projection.

Display device 2 is an example of the display device. Display unit 4 is an example of the display unit. Stand 6 is an example of the stand. Adjusting mechanism 8 is an example of the adjusting mechanism. Bolts 130 are an example of the first fastening member. Regulating mechanism 127 is an example of the regulating mechanism. Projection 126 is an example of the projection. Recess 44 is an example of the recess. Stand set 160 is an example of the stand set.

For example, display device 2 described in the first exemplary embodiment includes panel-shaped display unit 4, stand 6 to support display unit 4, adjusting mechanism 8 being attached to display unit 4 and enabling display unit 4 to move up and down relative to stand 6 and turn around stand 6, bolts 130 to fasten adjusting mechanism 8 to stand 6, and regulating mechanism 127 to regulate display unit 4 from descending relative to stand 6 when bolts 130 are removed. Regulating mechanism 127 includes projection 126 formed on adjusting mechanism 8, which is one of stand 6 and adjusting mechanism 8, and recess 44 being formed in stand 6, which is the other of stand 6 and adjusting mechanism 8, and being fitted onto projection 126.

Stand set 160 described in the first exemplary embodiment includes stand 6 to support panel-shaped display unit 4, adjusting mechanism 8 being attached to display unit 4 and enabling display unit 4 to move up and down relative to stand 6 and turn around stand 6, bolts 130 to fasten adjusting mechanism 8 to stand 6, and regulating mechanism 127 to regulate display unit 4 from descending relative to stand 6 when bolts 130 are removed. Regulating mechanism 127 includes projection 126 formed on adjusting mechanism 8, which is one of stand 6 and adjusting mechanism 8, and recess 44 being formed in stand 6, which is the other of stand 6 and adjusting mechanism 8, and being fitted onto projection 126.

In general, it is recommended that the height of a display unit above a floor and relative to a prop part of a stand supporting the display unit be adjusted with the display unit placed (laid) on the floor to prevent the display unit from falling onto the floor when bolts fastening the display unit to the prop part are removed from the prop part. Meanwhile, it is envisaged that a user may erroneously remove the bolts from the prop part with the display unit raised off the floor.

Nevertheless, in display device 2 and stand set 160 according to the present exemplary embodiment, adjusting mechanism 8 supporting display unit 4 is fastened to prop part 18 with bolts 130, with projection 126 fitted into recess 44 in regulating mechanism 127. This configuration, because of projection 126 fitted into recess 44, reduces the possibility that display unit 4 descends relative to stand 6 (display unit 4 falls onto the floor) even if bolts 130 are erroneously removed from prop part 18 with display unit 4 raised off the floor as shown in FIG. 1. This contributes to improved safety in the use of display device 2 (e.g., when the height of display unit 4 above the floor is adjusted).

In the display device, the stand may include a base member and a prop part standing on the base member and extending along a predetermined axis.

Base member 16 is an example of the base member. Axis C is an example of the predetermined axis. Prop part 18 is an example of the prop part.

For example, in display device 2 described in the first exemplary embodiment, stand 6 includes base member 16 and prop part 18 standing on base member 16 and extending along axis C.

In display device 2 thus configured, stand 6 is placed on the floor (the X-Y plane) substantially parallel to a horizontal plane, and prop part 18 extending along axis C substantially parallel to the vertical direction (the Z-axis direction) stands on base member 16. Consequently, display device 2 enables stand 6 to stably support display unit 4 fastened to prop part 18 via adjusting mechanism 8.

In the display device, the adjusting mechanism may include an attachment member attached to the display unit, a turning member being connected with the attachment member so as to be allowed to turn relative to the attachment member and being supported by the prop part so as to be movable relative to the prop part along the predetermined axis, a support member fastened to the prop part with the first fastening member, and a second fastening member to fasten the support member to the turning member. The projection may be formed on one of the prop part and the support member, whereas the recess may be formed in the other of the prop part and the support member.

Attachment member 48 is an example of the attachment member. Turning member 50 is an example of the turning member. Support member 62 is an example of the support member. Bolts 134 are an example of the second fastening member.

For example, in display device 2 described in the first exemplary embodiment, adjusting mechanism 8 includes attachment member 48 attached to display unit 4, turning member 50 being connected with attachment member 48 so as to be allowed to turn relative to attachment member 48 and being supported by prop part 18 so as to be movable relative to prop part 18 along axis C, support member 62 fastened to prop part 18 with bolts 130, and bolts 134 to fasten support member 62 to turning member 50. Projection 126 is formed on support member 62, which is one of prop part 18 and support member 62. Recess 44 is formed in prop part 18, which is the other of prop part 18 and support member 62.

In display device 2 thus configured, support member 62 can be removed from turning member 50 by unscrewing bolts 134 from turning member 50. Support member 62 can be removed from prop part 18 by unscrewing bolts 130 from prop part 18. As a result, by unscrewing bolts 130 from prop part 18 and unscrewing bolts 134 from turning member 50, display device 2 is put into a state where display unit 4 is movable relative to prop part 18. This configuration allows height H of display unit 4 above the floor to be readily adjusted.

In the display device, an outer peripheral surface of the prop part may have a groove portion extending along the predetermined axis. The support member may include a support body part and a protrusion part being formed on the support body part and being fitted into the groove portion.

Groove portion 38 is an example of the groove portion. Support body part 122 is an example of the support body part. Protrusion part 124 is an example of the protrusion part.

For example, in display device 2 described in the first exemplary embodiment, the outer peripheral surface of prop part 18 has groove portion 38 extending along axis C. Support member 62 includes support body part 122 and protrusion part 124 being formed on support body part 122 and being fitted into groove portion 38.

In display device 2 thus configured, protrusion part 124 of support member 62 is fitted into groove portion 38 of prop part 18 while display unit 4 is fastened to prop part 18 via adjusting mechanism 8. As a result, display device 2 prevents support member 62 from rattling against prop part 18 in the left-right direction (the X-axis direction) and hence enables stand 6 to stably support display unit 4.

In the display device, the projection may be formed on the protrusion part of the support member, and the recess may be formed in the groove portion of the prop part.

For example, in display device 2 described in the first exemplary embodiment, projection 126 is formed on protrusion part 124 of support member 62. Recess 44 is formed in groove portion 38 of prop part 18.

Display device 2 thus configured allows the work of fitting protrusion part 124 of support member 62 into groove portion 38 of prop part 18 and the work of fitting projection 126 on protrusion part 124 into recess 44 in groove portion 38 at the same time when performing the work of adjusting a position of adjusting mechanism 8 fastened to prop part 18 to change height H of display unit 4 above the floor, for example. This configuration allows the work of changing height H of display unit 4 above the floor with improved efficiency in display device 2 in which display unit 4 is fastened to prop part 18 via adjusting mechanism 8.

In the display device, the turning member may have a first opening through which the prop part is inserted and movable along the predetermined axis. One end part of the protrusion part may protrude outward of the support body part and may be inserted into the first opening.

Opening 84 is an example of the first opening. The upper end part of protrusion part 124 is an example of the one end part of the protrusion part.

For example, in display device 2 described in the first exemplary embodiment, turning member 50 has opening 84 through which prop part 18 is inserted and movable along axis C. The upper end part of protrusion part 124 (an end part on the positive Z-direction side) protrudes outward of support body part 122 (from an end on the positive Z-direction side (the upper end) of support body part 122 in the positive Z-direction) and is inserted into opening 84.

Even if bolts 130 are erroneously removed from prop part 18 with display unit 4 raised off the floor as shown in FIG. 1, the upper end part of protrusion part 124 gets caught on the periphery of opening 84 and as a result, display device 2 thus configured prevents support member 62 from being detached from prop part 18 rearward (in the negative Y-direction). Consequently, since projection 126 remains fitted into recess 44, display device 2 more effectively reduces the possibility that display unit 4 descends relative to stand 6 (display unit 4 falls onto the floor). In other words, this configuration contributes to improved safety in the use of display device 2 (e.g., when the height of display unit 4 above the floor is adjusted).

In the display device, the adjusting mechanism may enable the display unit to move up and down relative to the stand along the predetermined axis and may enable the display unit to turn relative to the stand around the predetermined axis.

For example, in display device 2 described in the first exemplary embodiment, adjusting mechanism 8 enables display unit 4 to move up and down relative to stand 6 along axis C and enables display unit 4 to turn relative to stand 6 around axis C.

Display device 2 thus configured allows display unit 4 to move up or down and turn relative to stand 6 and with respect to a single axis. This configuration contributes to a reduction in the size (a downsizing) of adjusting mechanism 8.

The display device may include a pair of third fastening members to fasten the attachment member to the turning member. The attachment member may have a second opening through which the prop part is inserted and movable along the predetermined axis and a pair of third openings disposed at positions substantially symmetric with respect to the second opening, wherein the pair of the third fastening members is inserted through the pair of the third openings such that the third fastening members are movable along a circumferential direction of the second opening. The pair of the third fastening members may be shoulder bolts.

Opening 70 is an example of the second opening. Guide openings 72 are an example of the third openings. Shoulder bolts 60 are an example of the third fastening members.

For example, display device 2 described in the first exemplary embodiment includes the pair of shoulder bolts 60 to fasten attachment member 48 to turning member 50. Attachment member 48 has opening 70 through which prop part 18 is inserted and movable along axis C and the pair of guide openings 72 disposed at positions substantially symmetric with respect to opening 70. The pair of shoulder bolts 60 is inserted through the pair of the guide openings such that the shoulder bolts are movable along the circumferential direction of opening 70.

In display device 2 thus configured, the pair of shoulder bolts 60 disposed at positions substantially symmetric with respect to axis C of prop part 18 (virtually symmetric with respect to the Y-Z plane along axis C, for example) is fastened to turning member 50 through the pair of guide openings 72 formed in attachment member 48. Guide openings 72 are each formed into a shape such that shoulder bolts 60 passing through guide openings 72 can move inside guide openings 72 along the circumferential direction of opening 70. Thus, display device 2 enables the pair of shoulder bolts 60 to fasten attachment member 48 to turning member 50 in a stable state and in a state in which attachment member 48 and turning member 50 can turn relative to each other. Moreover, in display device 2, the pair of shoulder bolts 60 serves to fasten attachment member 48 to turning member 50 with a substantially constant tightening torque.

The display device may further include a fourth fastening member to fasten the prop part to the base member in a direction substantially perpendicular to the predetermined axis. A lower end part of the prop part may form a plug portion. The base member may have a hole that corresponds in shape to the plug portion such that the plug portion is put into the hole. The plug portion may have a pair of inclined portions such that, in cross section substantially perpendicular to the predetermined axis, the pair of the inclined portions is disposed at positions substantially symmetric with respect to the fourth fastening member and is tilted relative to a fastening direction of the fourth fastening member.

Bolts 34 are an example of the fourth fastening member. Plug portion 30 is an example of the plug portion. Hole 26 is an example of the hole into which the plug portion is put. Inclined portions 36 are an example of the inclined portions.

For example, display device 2 described in the first exemplary embodiment further includes bolts 34 to fasten prop part 18 to base member 16 in a direction (the Y-axis direction) substantially perpendicular to axis C. The lower end part (an end part on the negative Z-direction side) of prop part 18 forms plug portion 30. Base member 16 has hole 26 that corresponds in shape to plug portion 30 such that plug portion 30 is put into the hole. Plug portion 30 has the pair of inclined portions 36 in cross section substantially perpendicular to axis C (a cross section parallel to the X-Y plane). The pair of inclined portions 36 is disposed at positions substantially symmetric with respect to bolts 34 (virtually symmetric with respect to the Y-Z plane along axis C), and is tilted relative to the fastening direction of bolts 34 (the Y-axis direction).

In display device 2 thus configured, prop part 18 is fastened to base member 16 with bolts 34 that are screwed into bolt holes 32 from the rear (the negative Y-direction side), and plug portion 30 is thereby drawn toward bolts 34 to the rear (the negative Y-direction side). The pair of inclined portions 36 is tilted such that the space between inclined portions 36 gradually gets narrower with an advance of the symmetrical center to the rear (in the negative Y-direction). Thus, when plug portion 30 is drawn by bolts 34 to the rear (in the negative Y-direction), the pair of inclined portions 36 presses an inner peripheral surface of hole 26. This configuration suppresses the occurrence of looseness at a joint between base member 16 and prop part 18 even if plug portion 30 is made smaller than hole 26 in cross section perpendicular to axis C (a cross-sectional size on the X-Y plane) in order to facilitate insertion of plug portion 30 into hole 26. As a result, display device 2 enables stand 6 to stably support display unit 4.

The substantially perpendicular described above represents a meaning of virtually perpendicular that is defined within a range in which the display device produces the effects described above and is permitted to have a range of variation in which the display device produces the effects described above.

The substantially symmetric described above represents a meaning of virtually symmetric that is defined within a range in which the display device produces the effects described above and is permitted to have a range of variation in which the display device produces the effects described above.

Second Exemplary Embodiment

Figure 14:
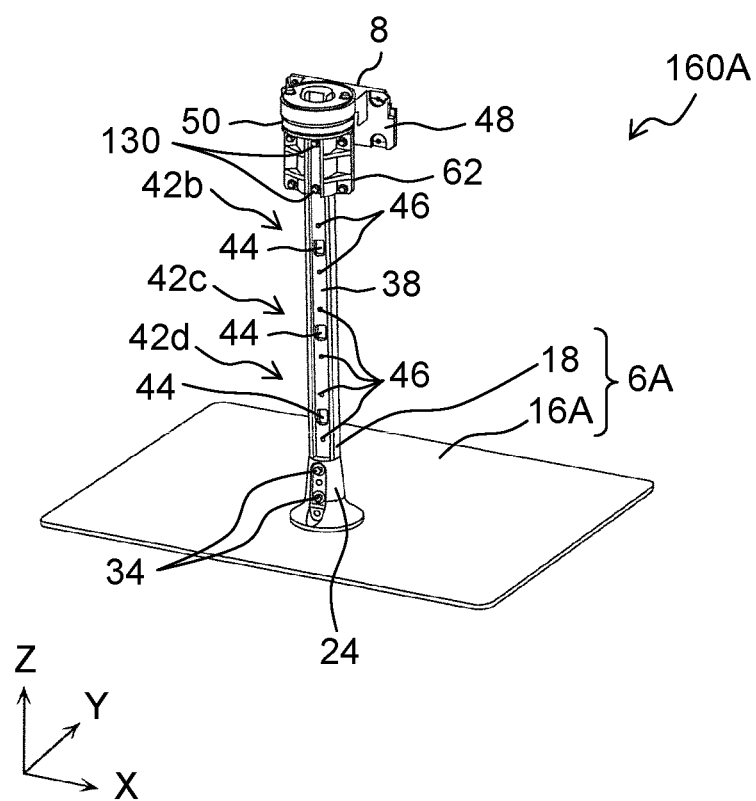
FIG. 14 is a perspective view schematically showing an example of a configuration of a stand set according to a second exemplary embodiment.

With reference to FIG. 14, a second exemplary embodiment will now be described.

FIG. 14 is a perspective view schematically showing an example of a configuration of stand set 160A according to the second exemplary embodiment.

Stand set 160A illustrated in the second exemplary embodiment shares substantially identical structural elements and functions with stand set 160 of the first exemplary embodiment except for a difference in shape between stand 6A and stand 6 of stand set 160 illustrated in the first exemplary embodiment. Hence, in the second exemplary embodiment, components substantially the same as the components described in the first exemplary embodiment are given reference marks identical to reference marks of the components described in the first exemplary embodiment, and descriptions thereof are omitted.

Stand set 160A includes stand 6A, adjusting mechanism 8, a plurality of (e.g., a pair of) bolts 130, and regulating mechanism 127 (see FIG. 7). Stand 6A includes base member 16A and prop part 18 that stands on base member 16A.

A display device substantially identical to display device 2 described in the first exemplary embodiment may be provided by combining stand set 160A with display unit 4 (see FIG. 1).

As shown in FIG. 14, unlike base member 16 described in the first exemplary embodiment, base member 16A of stand 6A in stand set 160A of the second exemplary embodiment is formed into a substantially rectangular plate shape in planar view (when viewed along the Z-axis direction). Stand set 160A thus configured allows base member 16A to have a larger area of contact with a floor than base member 16 described in the first exemplary embodiment does. As a result, stand set 160A of the second exemplary embodiment enables stand 6A to more stably support display unit 4 (see FIG. 1), for example.

Like stand set 160 described in the first exemplary embodiment, stand set 160A described in the second exemplary embodiment is an example of the stand set.

In other words, stand set 160A includes stand 6A to support panel-shaped display unit 4, adjusting mechanism 8 being attached to display unit 4 and enabling display unit 4 to move up and down relative to stand 6A and turn around stand 6A, bolts 130 to fasten adjusting mechanism 8 to stand 6A, and regulating mechanism 127 to regulate display unit 4 from descending relative to stand 6A when bolts 130 are removed. Regulating mechanism 127 includes projection 126 formed on adjusting mechanism 8, which is one of stand 6A and adjusting mechanism 8, and recess 44 being formed in stand 6A, which is the other of stand 6A and adjusting mechanism 8, and being fitted onto projection 126.

Stand set 160A thus configured can produce effects similar to those produced by stand set 160 described in the first exemplary embodiment.

Other Exemplary Embodiments

The first and second exemplary embodiments have been described above as an example of the technique disclosed in the present application. However, the technique in the present disclosure is not limited to these exemplary embodiments, and is also applicable to exemplary embodiments subjected to changes, replacements, additions, omissions, or the like. In addition, new exemplary embodiments can be made by combining constituent elements described in the foregoing first and second exemplary embodiments.

Accordingly, other exemplary embodiments will be described below.

The first and second exemplary embodiments have exemplified a configuration in which projection 126 is formed on support member 62 in adjusting mechanism 8 and recess 44 is formed in prop part 18 of stand 6(6A). However, the present disclosure is not limited to this configuration. For example, recess 44 may be formed in support member 62 in adjusting mechanism 8, and projection 126 may be formed on prop part 18 of stand 6(6A).

The first and second exemplary embodiments have exemplified a configuration in which display unit 4 can move up or down and turn relative to stand 6 and with respect to a single axis. However, the present disclosure is not limited to this configuration. For example, display unit 4 may be allowed to move up or down and turn relative to stand 6 and with respect to two axes. In other words, an axis along which display unit 4 moves up and down and an axis around which the display unit turns relative to stand 6(6A) may be different from each other.

The first and second exemplary embodiments have exemplified a configuration in which adjusting mechanism 8 has an up-and-down function to adjust height H in four levels and a swivel function to enable display unit 4 to turn (relative to the X-Z plane) within a range of −15° to +15°. However, these numeric values are merely example figures and should not be construed to limit the scope of the present disclosure. Adjusting mechanism 8 may have an up-and-down function to adjust height H in three levels or fewer, five levels or greater, or steplessly and a swivel function to adjust the orientation of the display screen relative to the X-Z plane within a range narrower or broader than the range of −15° to +15°.

The first and second exemplary embodiments have exemplified a configuration in which display device 2 is a liquid crystal television receiver. However, display device 2 may be a display device having any display panel such as an organic electro luminescence (EL) panel, other than the liquid crystal television receiver. Display device 2 may be a monitor device or a computer display device, for example, other than the television receiver.

The first and second exemplary embodiments have exemplified a configuration in which stand set 160(160A) supports display unit 4. However, the present disclosure is by no means limited to this configuration. Stand set 160(160A) may support any device with proviso that stand set 160 (160A) can support it. Examples of the device that can be supported by stand set 160(160A) include speakers, image projection screens, video cameras, and still cameras.

The first and second exemplary embodiments have exemplified a configuration in which four bolt holes 12 are formed in mounting bracket 14. However, the present disclosure is by no means limited to this configuration. A number of bolt holes 12 in mounting bracket 14 may be less than or equal to three or greater than or equal to five other than the four.

The first and second exemplary embodiments have exemplified a configuration in which two through holes 28 are formed in the lateral surface of joint part 24. However, the present disclosure is by no means limited to this configuration. A number of through holes 28 in joint part 24 may be one or three or greater other than the two.

The first and second exemplary embodiments have exemplified a configuration in which side wall part 82 has four bolt holes 94 in total, i.e., two holes are formed in each of lateral parts 82a. However, the present disclosure is by no means limited to this configuration. A number of bolt holes 94 in side wall part 82 may be less than or equal to three or greater than or equal to five other than the four.

The first and second exemplary embodiments have exemplified a configuration in which attachment part 64 of attachment member 48 has four through holes 68. However, the present disclosure is by no means limited to this configuration. A number of through holes 68 in attachment part 64 may be less than or equal to three or greater than or equal to five.

The first and second exemplary embodiments have exemplified a configuration in which adjusting mechanism 8 includes the pair of shoulder bolts 60. However, the present disclosure is by no means limited to this configuration. A number of shoulder bolts 60 included in adjusting mechanism 8 may be any number other than the two.

The first and second exemplary embodiments have exemplified a configuration in which attachment member 48 and turning member 50 are formed from a metal such as die-cast aluminum. However, the present disclosure is by no means limited to this configuration. Attachment member 48 and turning member 50 may be formed from any material other than the metal, with proviso that the material has strength and durability necessary for these components.

The first and second exemplary embodiments have exemplified a configuration in which resin washer 54 and resin washer 56 are formed from a synthetic resin such as a polyacetal (POM). However, the present disclosure is by no means limited to this configuration. Resin washers 54 and 56 may be formed from any material, with proviso that the material permits these components to function as washers.

The first and second exemplary embodiments have exemplified a configuration in which metallic washer 52 is formed from a metal such as SPCC. However, the present disclosure is by no means limited to this configuration. Metallic washer 52 may be formed from any material, with proviso that the material permits the component to function as a washer.

The first and second exemplary embodiments have exemplified a configuration in which resin washer 58 is formed from a synthetic resin such as an ABS resin. However, the present disclosure is by no means limited to this configuration. Resin washer 58 may be formed from any material, with proviso that the material permits the component to function as a washer.

The first and second exemplary embodiments have exemplified a configuration in which positioning recesses 74 are recesses formed by depressing the top face of support part 66 downward (in the negative Z-direction). However, the present disclosure is by no means limited to this configuration. For example, positioning recesses 74 may be holes passing through support part 66 from the top face in the vertical direction (the Z-axis direction).

The first and second exemplary embodiments have exemplified a configuration in which positioning recesses 76 are recesses formed by depressing the bottom face of support part 66 upward (in the positive Z-direction). However, the present disclosure is by no means limited to this configuration. For example, positioning recesses 76 may be holes passing through support part 66 from the bottom face in the vertical direction (the Z-axis direction).

The first and second exemplary embodiments have exemplified a configuration in which turning regulating recess 78 is a recess formed by depressing the bottom face of support part 66 upward (in the positive Z-direction). However, the present disclosure is by no means limited to this configuration. For example, turning regulating recess 78 may be a hole passing through support part 66 from the bottom face in the vertical direction (the Z-axis direction).

The first and second exemplary embodiments have exemplified a configuration in which positioning recesses 90 are recesses formed by depressing the top face of base part 80 downward (in the negative Z-direction). However, the present disclosure is by no means limited to this configuration. For example, positioning recesses 90 may be holes passing through base part 80 in the vertical direction (the Z-axis direction).

The first and second exemplary embodiments have exemplified a configuration in which length L of large-diameter portion 60b of each shoulder bolt 60 in the axial direction (in the Z-axis direction) is about 0.5 mm shorter than a sum of thicknesses (sizes in the Z-axis direction) of metallic washer 52, resin washer 54, support part 66, resin washer 56, and resin washer 58. However, the present disclosure is by no means limited to this configuration. It is preferred that length L of large-diameter portion 60b of each shoulder bolt 60 in the axial direction (in the Z-axis direction) be set appropriately in accordance with materials and thicknesses of the components, specifications of stand set 160(160A), and other conditions.

The exemplary embodiments have been described above as examples of the technique in the present disclosure. For that purpose, the accompanying drawings and detailed descriptions have been provided.

The constituent elements described in the accompanying drawings and detailed descriptions, therefore, may include not only the constituent elements essential for solving problems but also constituent elements not essential for solving the problems, for the purpose of describing the above technique. These non-essential constituent elements therefore should not be instantly construed as being essential, based on the fact that the non-essential constituent elements are illustrated and described in the accompanying drawings and the detailed description.

Further, the foregoing exemplary embodiments are provided to exemplify the technique in the present disclosure, and thus various alterations, substitutions, additions, omissions, and the like can be made within the scope of the claims or equivalents of the claims.

INDUSTRIAL APPLICABILITY

The present disclosure is applicable to display devices and stand sets. Specifically, the present disclosure is applicable to a display device including a floor-positioned stand, and other similar devices, for example.

REFERENCE MARKS IN THE DRAWINGS

2: display device
4: display unit
6, 6A: stand
8: adjusting mechanism
10: housing
12, 32, 46, 88, 94: bolt hole
14: mounting bracket
16, 16A: base member
18: prop part
20, 34, 130, 134: bolt
22: covering member
24: joint part
26: hole
28, 68, 104, 116, 128, 132: through hole
30: plug portion
36: inclined portion
38: groove portion
40: cable
42a, 42b, 42c, 42d: height adjusting portion
44: recess
48: attachment member
50: turning member
52: metallic washer
54, 56, 58: resin washer
60: shoulder bolt
60a: shank portion
60b: large-diameter portion
62: support member
64: attachment part
66: support part
70, 84, 96, 102, 106, 114: opening
72, 100, 110: guide opening
74, 76, 90: positioning recess
78: turning regulating recess
80: base part
82: side wall part
82a: lateral part
86, 115: support tube part
92: turning regulating projection
98, 108, 118: positioning projection
112, 120: turning regulating opening
122: support body part
124: protrusion part
126: projection
127: regulating mechanism
160, 160A: stand set

The invention claimed is:
1. A display device comprising:
a display unit having a panel-shape; a stand supporting the display unit;
an adjusting mechanism being attached to the display unit and enabling the display unit to move up and down relative to the stand and turn around the stand;
a first fastening member fastening the adjusting mechanism to the stand; and
a regulating mechanism regulating the display unit from descending relative to the stand when the first fastening member is removed,
wherein the regulating mechanism includes:
a projection being formed on one of the stand and the adjusting mechanism; and
a recess being formed in another one of the stand and the adjusting mechanism and being fitted onto the projection,
wherein the stand includes:
a base member; and
a prop part standing on the base member and extending along a predetermined axis,
wherein the adjusting mechanism includes:
an attachment member being attached to the display unit;
a turning member being connected with the attachment member so as to be allowed to turn relative to the attachment member and being supported by the prop part so as to be movable relative to the prop part along the predetermined axis; a
support member being fastened to the prop part with the first fastening member; and
a second fastening member fastening the support member to the turning member,
wherein when the projection is formed on the stand, the prop part of the stand has the projection, and when the projection is formed on the adjusting mechanism, the support member of the adjusting mechanism has the projection,
wherein when the recess is formed in the stand, the prop part of the stand has the recess, and when the recess is formed in the adjusting mechanism, the support member of the adjusting mechanism has the recess,
wherein the adjusting mechanism enables the display unit to move up and down relative to the stand along the predetermined axis and enables the display unit to turn relative to the stand around the predetermined axis,
wherein the display device further comprises a pair of third fastening members fastening the attachment member to the turning member, wherein the attachment member includes:
- a second opening through which the prop part is inserted movably along the predetermined axis; and
- a pair of third openings being disposed at positions substantially symmetric with respect to the second opening, and
- wherein the pair of the third fastening members are inserted into the pair of the third openings, allowing the pair of the third fastening members to be movable along a circumferential direction with respect to the second opening.

2. The display device according to claim 1, wherein each of the pair of the third fastening members is a shoulder bolt.

3. The display device according to claim 1, wherein an outer peripheral surface of the prop part has a groove portion extending along the predetermined axis, and the support member includes:
- a support body part; and
- a protrusion part being formed on the support body part and being fitted into the groove portion.

4. The display device according to claim 3, wherein the projection is formed on the protrusion part of the support member, and the recess is formed in the groove portion of the prop part.

5. The display device according to claim 3, wherein the turning member has a first opening through which the prop part is inserted movably along the predetermined axis, and one end part of the protrusion part protrudes outward of the support body part and is inserted into the first opening.

6. A stand set comprising: a stand supporting a display unit that has a panel-shape;
- an adjusting mechanism configured to be attached to the display unit and configured to enable the display unit to move up and down relative to the stand and turn around the stand;
- a first fastening member fastening the adjusting mechanism to the stand; and a regulating mechanism configured to regulate the display unit from descending relative to the stand when the first fastening member is removed,
- wherein the regulating mechanism includes a projection being formed on one of the stand and the adjusting mechanism, and a recess being formed in another one of the stand and the adjusting mechanism and being fitted onto the projection,
- wherein the stand includes:
- a base member; and
- a prop part standing on the base member and extending along a predetermined axis,
- wherein the adjusting mechanism includes;
  - an attachment member configured to be attached to the display unit; a turning member being connected with the attachment member so as to be allowed to turn relative to the attachment member and being supported by the prop part so as to be movable relative to the prop part along the predetermined axis;
  - a support member being fastened to the prop part with the first fastening member;
and
  - a second fastening member fastening the support member to the turning member, wherein when the projection is formed on the stand, the prop part of the stand has the projection, and when the projection is formed on the adjusting mechanism, the support member of the adjusting mechanism has the projection,
- wherein when the recess is formed in the stand, the prop part of the stand has the recess, and when the recess is formed in the adjusting mechanism, the support member of the adjusting mechanism has the recess,
- wherein the adjusting mechanism is configured to enable the display unit to move up and down relative to the stand along the predetermined axis and is configured to enable the display unit to turn relative to the stand around the predetermined axis,
- wherein the stand set further comprises a pair of third fastening members fastening the attachment member to the turning member,
- wherein the attachment member includes:
  - a second opening through which the prop part is inserted movably along the predetermined axis; and
  - a pair of third openings being disposed at positions substantially symmetric with respect to the second opening, and
- wherein the pair of the third fastening members are inserted into the pair of the third openings, allowing the pair of the third fastening members to be movable along a circumferential direction with respect to the second opening.

* * * * *